United States Patent
Kotani et al.

(10) Patent No.: US 10,340,686 B2
(45) Date of Patent: Jul. 2, 2019

(54) ELECTRONIC DEVICE

(71) Applicant: DENSO CORPORATION, Kariya, Aichi-pref. (JP)

(72) Inventors: Yasuhiro Kotani, Kariya (JP); Takao Kuroda, Kariya (JP); Takuya Sugie, Kariya (JP)

(73) Assignee: DENSO CORPORATION, Kariya (JP)

( * ) Notice: Subject to any disclaimer, the term of this patent is extended or adjusted under 35 U.S.C. 154(b) by 590 days.

(21) Appl. No.: 14/953,782

(22) Filed: Nov. 30, 2015

(65) Prior Publication Data

US 2016/0172846 A1    Jun. 16, 2016

(30) Foreign Application Priority Data

Dec. 11, 2014  (JP) .................................. 2014-251193
Dec. 11, 2014  (JP) .................................. 2014-251194

(51) Int. Cl.
*H02H 9/04*     (2006.01)
*G01R 19/165*   (2006.01)
*H03J 3/20*     (2006.01)

(52) U.S. Cl.
CPC ......... *H02H 9/04* (2013.01); *G01R 19/16523* (2013.01); *H03J 3/20* (2013.01)

(58) Field of Classification Search
CPC ........ H02H 9/04; G01R 19/16523; H03J 3/20
USPC ......................................................... 361/56
See application file for complete search history.

(56) References Cited

U.S. PATENT DOCUMENTS

| | | | | |
|---|---|---|---|---|
| 4,531,117 A | * | 7/1985 | Nourse | G08B 13/2414 340/572.4 |
| 2005/0077551 A1 | | 4/2005 | Halamik et al. | |
| 2005/0225362 A1 | | 10/2005 | Halamik et al. | |
| 2005/0275379 A1 | | 12/2005 | Tsukamoto et al. | |
| 2006/0270933 A1 | * | 11/2006 | Benson | A61B 5/06 600/424 |
| 2007/0008842 A1 | | 1/2007 | Baba et al. | |
| 2007/0190700 A1 | | 8/2007 | Halamik et al. | |
| 2007/0195483 A1 | * | 8/2007 | Asano | H03H 7/0153 361/272 |
| 2008/0079537 A1 | * | 4/2008 | Touge | E05B 81/78 340/5.72 |

(Continued)

FOREIGN PATENT DOCUMENTS

| | | |
|---|---|---|
| JP | 49-040733 U1 | 4/1974 |
| JP | 08-018472 A | 1/1996 |

(Continued)

*Primary Examiner* — Zeev V Kitov
(74) *Attorney, Agent, or Firm* — Posz Law Group, PLC

(57) ABSTRACT

An electronic device that has a circuit network therein and conducts at least one of power reception and communication with an external device through a wire harness includes a detection circuit and a resonance frequency shift circuit. The detection circuit detects a voltage variation caused by a noise that has a frequency component near a resonance frequency and superimposes on at least one of the wire harness and the circuit network. The resonance frequency is determined based on a characteristic impedance of the wire harness and the circuit network. The resonance frequency shift circuit shifts the resonance frequency by changing at least one of a capacitance and an inductance of the circuit network based on a level of the voltage variation detected by the detection circuit.

14 Claims, 13 Drawing Sheets

(56) References Cited

U.S. PATENT DOCUMENTS

| | | | | |
|---|---|---|---|---|
| 2009/0091370 A1* | 4/2009 | Kawasaki | ............... | H03J 3/20 |
| | | | | 327/365 |
| 2010/0084467 A1* | 4/2010 | Nishido | ............ | G06K 19/0701 |
| | | | | 235/451 |
| 2010/0133583 A1 | 6/2010 | Mawatari et al. | | |
| 2013/0049654 A1 | 2/2013 | Kure | | |
| 2014/0266482 A1* | 9/2014 | Ishii | ..................... | H03B 5/30 |
| | | | | 331/154 |

FOREIGN PATENT DOCUMENTS

| | | |
|---|---|---|
| JP | 08-162930 A | 6/1996 |
| JP | 11-018291 A | 1/1999 |
| JP | 2008-103490 A | 5/2008 |
| JP | 2011-009291 A | 1/2011 |
| JP | 2013-198035 A | 9/2013 |

* cited by examiner

ELECTRONIC DEVICE

CROSS REFERENCE TO RELATED APPLICATIONS

This application is based on Japanese Patent Applications No. 2014-251193 filed on Dec. 11, 2014 and No. 2014-251194 filed on Dec. 11, 2014, the disclosures of which are incorporated herein by reference.

TECHNICAL FIELD

The present disclosure relates to an electronic device.

BACKGROUND

An electronic device will malfunction due to noise generated in or around the electronic device. For enhancing a noise resistance that restricts malfunction of the electronic device when the noise is generated, that is, for enhancing immunity, various means have been proposed.

For example, in JP 2009-94133 A which corresponds to US 2009/0091370 A1, inner potential variation of a Large Scale Integration (LSI) is analyzed. When it is determined that the inner potential variation of the LSI is in a resonance mode, capacitance or resistance in the LSI is changed such that a resonance frequency does not overlap an operation frequency.

For example, in JP 2012-23953 A which corresponds to US 2005/0225362 A1, an electronic device has a transistor that is turned on when voltage generated by Electra Static Discharge (ESD) is applied to a gate terminal. When the transistor is turned on, another transistor that draws an electric current generated by the ESD therein is turned on.

SUMMARY

In an electronic device equipped to a vehicle, the electronic device is connected to a wire harness and conducts at least one of power reception and communication through the wire harness. A length of the wire harness is different depending on the type of vehicle even when the same electronic device is used. Therefore, characteristic impedances of the wire harness and the circuit network in the electronic device change depending on the type of vehicle to which the electronic device is equipped.

Therefore, even when an electronic device has passed an immunity test before being equipped to a vehicle, voltage variation larger than that assumed in the design will occur due to a noise with a frequency component near a resonance frequency in a state being equipped to the vehicle and the electronic device malfunctions. In the present disclosure, "near the resonance frequency" means the resonance frequency and frequencies in the vicinity of the resonance frequency.

The art disclosed in JP 2009-94133 A relates to an LSI integrated in a system board. JP 2009-94133 A does not disclose that a malfunction of the electronic device is restricted when the noise with the frequency component near the resonance frequency superimposes on the circuit network including the wire harness and the electronic device.

In the ESD, a pulsed electromagnetic wave with a high voltage is generated. When an on-voltage of a transistor detecting the ESD is low, the transistor drawing the electric current generated by the ESD therein will be turned on by a low-level voltage variation. Originally, the transistor drawing the electric current therein needs not to be turned on by such a low-level voltage variation. As a result, regular operation will be unexpectedly limited. Therefore, for the transistor detecting the ESD, a transistor that is turned on by a high voltage is employed.

As the type of the noise, noise with an alternating current component is widely known, in addition to the pulsed noise generated by the ESD. The electronic device is generally designed to have resistance to the noise with the alternating current component. At a specific frequency, however, LC resonance occurs and a voltage variation larger than that assumed in the design will occur.

When the noise generated in the electronic device and a radio wave coming from outside have frequency components near a resonance frequency of a circuit network including the electronic device, the voltage variation in the circuit network larger than that assumed in the design will occur and the electronic device will malfunction.

Also, when the electronic device is in a standby state, such as a case where a vehicle is parked, an impedance in the electronic device is high because an electric current flowing in the electronic device is small. When the impedance is high, large voltage variation is likely to occur in the circuit network even by relatively small noise. Therefore, there is a high possibility that the electronic device malfunctions.

It is an object of the present disclosure to provide an electronic device capable of conducting at least one of power source supplying and communication with an external device through a wire harness, and capable of being restricted from malfunctioning.

According to an aspect of the present disclosure, an electronic device that has a circuit network therein and conducts at least one of power reception and communication with an external device through a wire harness includes a detection circuit and a resonance frequency shift circuit. The detection circuit detects a voltage variation caused by a noise that has a frequency component near a resonance frequency and superimposes on at least one of the wire harness and the circuit network. The resonance frequency is determined based on a characteristic impedance of the wire harness and the circuit network. The resonance frequency shift circuit shifts the resonance frequency by changing at least one of a capacitance and an inductance of the circuit network based on a level of the voltage variation detected by the detection circuit.

The electronic device of the present disclosure has the detection circuit detecting the voltage variation caused by the noise that has the frequency component near the resonance frequency and superimposes on at least one of the wire harness and the circuit network. The resonance frequency is determined based on the characteristic impedance of the wire harness and the circuit network. Accordingly, a noise with a frequency component near a resonance frequency of the circuit network in actual use, such as in an actually equipped state to a vehicle.

The resonance frequency shift circuit shifts the resonance frequency in based on the level of the voltage variation detected by the detecting circuit. When the resonance frequency is shifted, large voltage variation caused by the noise with the frequency component near the resonance frequency can be reduced. Therefore, malfunction of the electronic device can be restricted even when the voltage variation larger than that assumed in the design occurs due to the noise with the frequency component near the resonance frequency.

According to another aspect of the present disclosure, an electronic device that has a circuit network therein and conducts at least one of power reception and communication with an external device through a wire harness includes a detection circuit and a protection circuit. The detection circuit detects a voltage variation caused by a noise that has a frequency component near a resonance frequency and superimposes on at least one of the wire harness and the circuit network. The protection circuit performs a predetermined protection operation based on a level of the voltage variation detected by the detection circuit.

The electronic device of the present disclosure has the detection circuit detecting the voltage variation caused by the noise that has the frequency component near the resonance frequency and superimposes on at least one of the wire harness and the circuit network. The resonance frequency is determined based on the characteristic impedance of the wire harness and the circuit network. Accordingly, a noise with a frequency component near a resonance frequency of the circuit network in actual use, such as in an actually equipped state to a vehicle.

The protection circuit performs the predetermined protection operation based on a level of the voltage variation detected by the detection circuit. Therefore, malfunction of the electronic device can be restricted even when the voltage variation larger than that assumed in the design occurs due to the noise with the frequency component near the resonance frequency.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings.

First Embodiment

Figure 1:
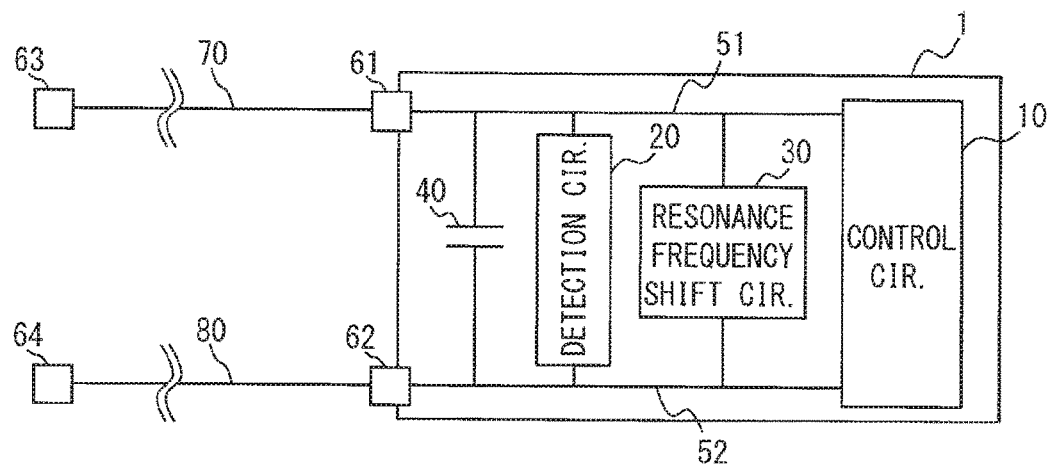
FIG. 1 is a schematic block diagram of an ECU according to a first embodiment of the present disclosure.

FIG. 1 illustrates a schematic block diagram of an Electronic Control Unit (ECU) 1 as a first embodiment of an electronic device of the present disclosure. The ECU 1 is assumed to be equipped to a vehicle.

(Overall Structure)

As shown in FIG. 1, the ECU 1 has a control circuit 10, a detection circuit 20, a resonance frequency shift circuit 30, a capacitor 40 and terminals 61, 62. The terminals 61, 62 are connected to ends of wire harnesses 70, 80. Opposite ends of the wire harnesses 70, 80 are connected to terminals 63, 64. In the present embodiment, the terminal 63 is connected to a vehicle battery, and the terminal 64 is connected to the ground. Therefore, the ECU 1 receives power through the wire harnesses 70, 80. Hereinafter, a circuit network in the ECU 1 is referred to as an ECU circuit network, and a circuit network including the wire harnesses 70, 80 and the ECU 1 is referred to as a whole circuit network.

In the ECU 1, the terminal 61 is connected to one end of a power supply wiring 51, and the terminal 62 is connected to one end of a ground wiring 52.

The capacitor 40 has a first end connected to the power supply wiring 51, and a second end connected to the ground wiring 52. The capacitor 40 smooths an electric current flowing in the power supply wiring 51.

The power supply wiring 51 is connected to the control circuit 10, the detection circuit 20 and the resonance frequency shift circuit 30. The ground wiring 52 is connected to the control circuit 10, the detection circuit 20 and the resonance frequency shift circuit 30.

The control circuit 10 executes a predetermined control. The control circuit 10 may be one of a digital circuit, an analog circuit or a combination of the digital circuit and the analog circuit. The control executed by the control circuit 10 is not especially limited. For example, the control circuit 10 controls an in-vehicle motor, which is not illustrated.

The detection circuit 20 detects a voltage variation that occurs in the power supply wiring 51 where noise superimposes on the wire harness 70 or the ECU circuit network. A concrete structure of the detection circuit 20 will be described later with reference to FIG. 3.

The resonance frequency shift circuit 30 shifts a resonance frequency of the whole circuit network as a protection operation protecting the control circuit 10, when a level of the voltage variation detected by the detection circuit 20 is equal to or higher than a predetermined level. A concrete structure of the resonance frequency shift circuit 30 will be described later with reference to FIG. 3.

Figure 2:
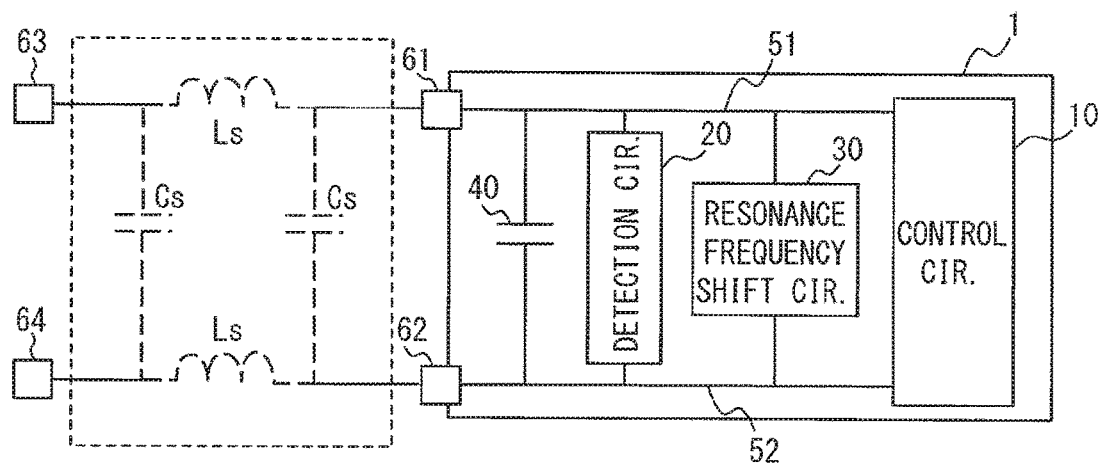
FIG. 2 is a diagram conceptually illustrating parasitic capacitances and parasitic inductances of wire harnesses of FIG. 1.

As conceptually shown in FIG. 2, the wire harnesses 70, 80 connected to the ECU 1 have parasitic capacitances Cs and parasitic inductances Ls. The wire harnesses 70, 80 have different length and different distance to body earth depending on the type of vehicle. Therefore, characteristic impedances of the wire harnesses 70, 80 differ depending on the type of vehicle.

Since the characteristic impedances of the wire harnesses 70, 80 differ depending on the type of vehicle, a characteristic impedance of the whole circuit network differs depending on the type of vehicle. Therefore, a resonance frequency $f_0$ of the whole circuit network, which is determined based on the characteristic impedance, differs depending on the type of vehicle.

When the noise superimposing on the wire harnesses 70, 80 or the ECU circuit network has a frequency component near the resonance frequency of the whole circuit network, a large voltage variation occurs in the whole circuit network.

Generally, the ECU 1 is examined before being equipped to a vehicle by an immunity test that is executed in a predetermined method. Since the immunity test is executed before the ECU 1 is equipped to the vehicle, it is difficult to consider the characteristic impedances of the wire harnesses 70, 80, which differ depending on the type of vehicle. Therefore, even when countermeasures are made for noise with a frequency component near a resonance frequency considering characteristic impedance under a condition of the immunity test, there is a possibility that malfunction of the ECU 1 cannot be restricted in a state where the ECU 1 is equipped to the vehicle.

When the ECU 1 is in a standby state, such as a state where a vehicle is parked, an impedance in the ECU 1 is high because an electric current flowing in the ECU 1 is small. When the impedance is high, large voltage variation is likely to occur in the whole circuit network even by relatively small noise. Therefore, there is a high possibility that the ECU 1 malfunctions.

In the present embodiment, therefore, the detection circuit 20 and the resonance frequency shift circuit 30 enhance immunity of the electronic device. Specifically, the detection circuit 20 and the resonance frequency shift circuit 30 have the structures shown in FIG. 3.

(Structure of Detection Circuit 20)

Figure 3:
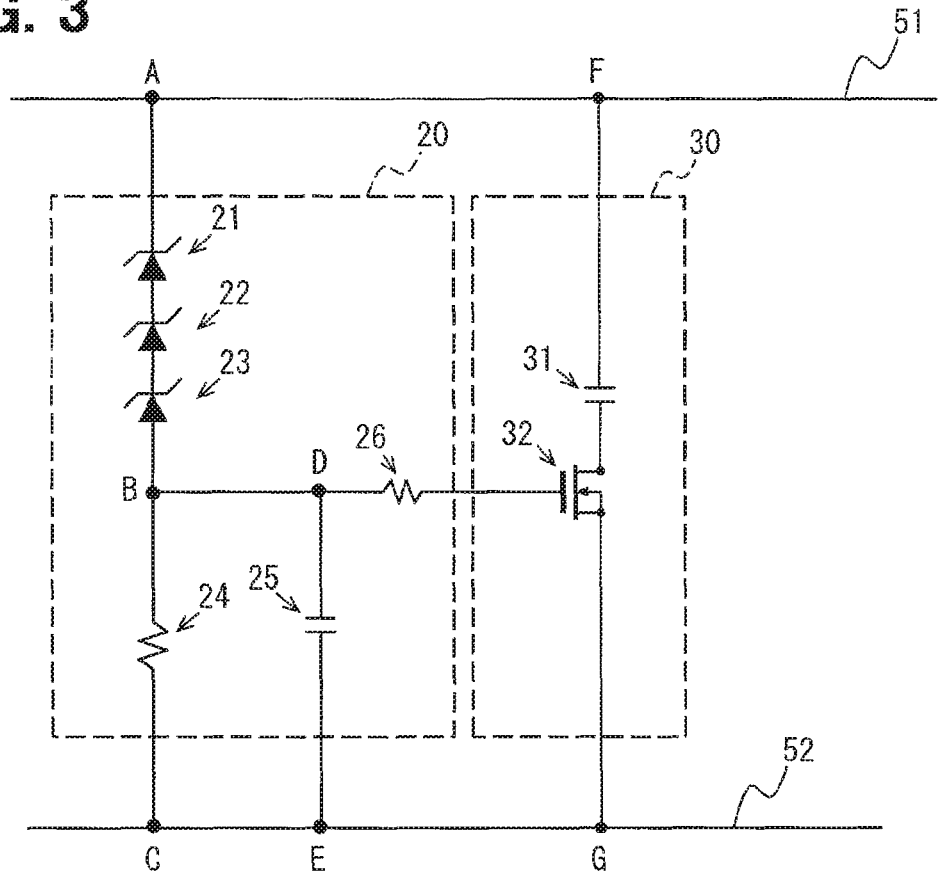
FIG. 3 is a diagram illustrating structures of a detection circuit and a resonance frequency shift circuit of FIG. 1.

As shown in FIG. 3, the detection circuit 20 has three Zener diodes 21 to 23, a resistor 24, a capacitor 25 and a resistor 26. The three Zener diodes 21 to 23 and the resistor 24 are connected in series in this order. An end of the Zener diode 21 is connected to the power supply wiring 51 and an end of the resistor 24 is connected to the ground wiring 52.

The capacitor 25 is connected to the resistor 24 in parallel. The capacitor 25 has a first end connected to a point between the Zener diode 23 and the resistor 24, and a second end connected to the ground wiring 52. The capacitor 25 corresponds to a first capacitor.

The resistor 26 has a first end connected to the first end of the capacitor 25, which is not connected to the ground wiring 52, and a second end connected to a gate terminal of a MOSFET 32.

The Zener diodes 21 to 23 have cathode terminals toward the power supply wiring 51. The sum of breakdown voltages of the three Zener diodes 21 to 23 is hereinafter referred to as a total breakdown voltage. The total breakdown voltage is set such that voltage of the power supply wiring 51 can exceed the total breakdown voltage when the noise with the frequency component near the resonance frequency superimposes on the whole circuit network and the large voltage variation occurs in the power supply wiring 51. When power source voltage is 12V, for example, the total breakdown voltage is from 24 V to 30 V.

(Structure of Resonance Frequency Shift Circuit 30)

The resonance frequency shift circuit 30 is connected to the power supply wiring 51 and the ground wiring 52. As shown in FIG. 3, the resonance frequency shift circuit 30 includes a capacitor 31 and the MOSFET 32.

The capacitor 31 has a first end connected to the power supply wiring 51, and a second end connected to a drain terminal of the MOSFET 32. The capacitor 31 corresponds to a second capacitor.

The MOSFET 32 is an n-channel type transistor, and has the gate terminal connected to the resistor 26, the drain terminal connected to the power supply wiring 51, and a source terminal connected to the ground wiring 52.

(Operation of Detection Circuit 20 and Resonance Frequency Shift Circuit 30)

Next, an operation of the detection circuit 20 and the resonance frequency shift circuit 30 will be described. When the voltage of the power supply wiring 51 exceeds the total breakdown voltage, an electric current flows as follows: A→B→D→E. The capacitor 25 is charged with the electric current.

Voltage at a point D increases as the capacitor 25 is charged. Voltage applied to the gate terminal of the MOSFET 32 through the resistor 26 increases as the voltage at the point D increases. When the capacitor 25 is not charged, the gate terminal of the MOSFET 32 is pulled-down to the ground through the resistor 26 and 24.

The MOSFET 32 is turned on when charged voltage of the capacitor 25 exceeds a predetermined voltage capable of turning on the MOSFET 32 (hereinafter, referred to as a transistor-on-voltage). When the MOSFET 32 is turned on, a line FG between a point F and a point G is conducted. The capacitor 31 is charged with potential according to the voltage of the power supply wiring 51 having the voltage variation. As such, the characteristic impedance of the whole circuit network changes. Therefore, the resonance frequency of the whole circuit network also changes.

Figure 4A:
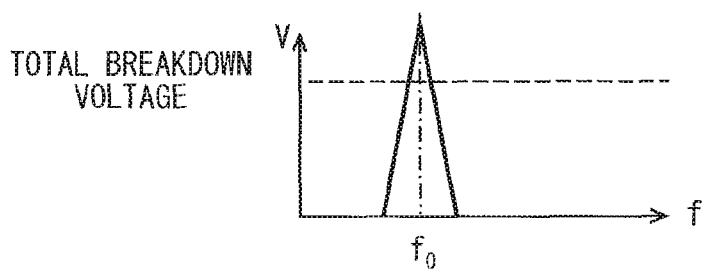
FIGS. 4A and 4B are diagrams illustrating effects of the first embodiment.
Figure 4B:
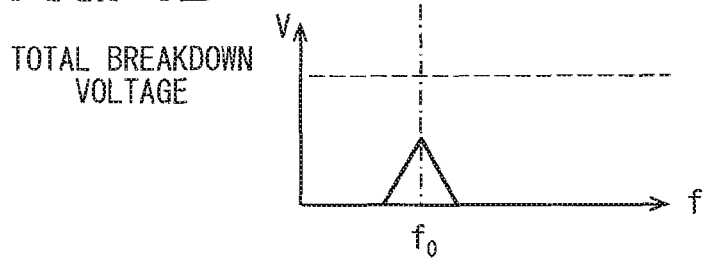

Even when the noise superimposing on the whole circuit network has a frequency component near the resonance frequency of the whole circuit network and the voltage of the power supply wiring 51 exceeds the total breakdown voltage as shown in FIG. 4A, the resonance frequency is shifted to decrease the voltage variation of the power supply wiring 51 as shown in FIG. 4B. In FIGS. 4A and 4B, $f_o$ expresses the resonance frequency before the MOSFET is turned on.

When the voltage variation of the power supply wiring 51 is decreased, charge of the capacitor 25 charged in the capacitor 25 is discharged through points D, B and C to turn off the MOSFET 32. In a case where the charged voltage of the capacitor 25 is lower than the voltage of the power supply wiring 51, an electric current from the capacitor 25 flows also to points B and A.

Since the electric current flows from the capacitor 25 to the points D, B and C also before the charged voltage of the capacitor 25 reaches the transistor-on-voltage, the charged voltage of the capacitor 25 decreases. When the noise has an alternating current component, two states of the voltage of the power supply wiring 51 are repeated, one being a state where the voltage of the power supply wiring 51 is higher than the total breakdown voltage, the other being a state where the voltage of the power supply wiring 51 is lower than the total breakdown voltage. Even when the amount of voltage charged by one cycle of the noise is small, the charged voltage of the capacitor 25 reaches the transistor-on-voltage when the voltage of the power supply wiring 51 exceeds the total breakdown voltage repeatedly.

Therefore, the charged voltage of the capacitor 25 indicates magnitude of the voltage of the power supply wiring 51 exceeding the total breakdown voltage due to the noise. The charged voltage of the capacitor 25 also indicates duration of the noise. In other words, the detection circuit 20 detects whether the magnitude and the duration of the voltage variation in the power supply wiring 51 caused by the noise are equal to or more than level in which the charged voltage of the capacitor 25 exceeds the transistor-on-voltage.

When the voltage of the power supply wiring 51 exceeds the total breakdown voltage, the capacitor 25 is charged regardless of the frequency component of the noise. When the noise includes a frequency component near the resonance frequency of the whole circuit network, the voltage of the power supply wiring 51 is likely to exceed the total breakdown voltage. Therefore, the detection circuit 20 mainly detects noise with a frequency component near the resonance frequency of the whole circuit network.

(Advantageous Effects of the First Embodiment)

The ECU 1 of the first embodiment described above has the detection circuit 20. The detection circuit 20 includes the capacitor 25 that is charged when the voltage of the power supply wiring 51 exceeds the total breakdown voltage. When the charged voltage of the capacitor 25 exceeds the transistor-on-voltage, the MOSFET 32 is turned on and the resonance frequency shift circuit 30 operates.

That is, the detection circuit 20 detects the voltage variation occurring in the power supply wiring 51. Although the resonance frequency $f_0$ is different depending on the type of vehicle to which the ECU 1 is equipped, the detection circuit 20 can detect the noise with the resonance frequency $f_0$ and frequency components near the resonance frequency $f_0$.

When the resonance frequency shift circuit 30 operates, the resonance frequency of the whole circuit network is shifted to decrease the voltage variation of the power supply wiring 51 as shown in FIG. 4B.

When the voltage variation occurring in the power supply wiring 51 is larger than that assumed in the design of the ECU 1, the resonance frequency shift circuit 30 immediately operates to shift the resonance frequency of the whole circuit network and decrease the voltage variation. Therefore, the malfunction of the ECU 1 can be restricted.

In the present embodiment, the resonance frequency shift circuit 30 operates using the charged voltage of the capacitor 25. Another power source is not required, differently from a case using the microcomputer or the like. Therefore, the present embodiment is suitable to reduce a standby electricity consumption is preferable to be decreased, for example, when the vehicle is parked.

Second Embodiment

Next, a second embodiment will be described. In the following description, unless especially mentioned, an element having the same symbol as a symbol used in the previous embodiment is same as an element described in the previous embodiment. When a part of a structure is described, the embodiment previously described may be applied to the other structure.

Figure 5:
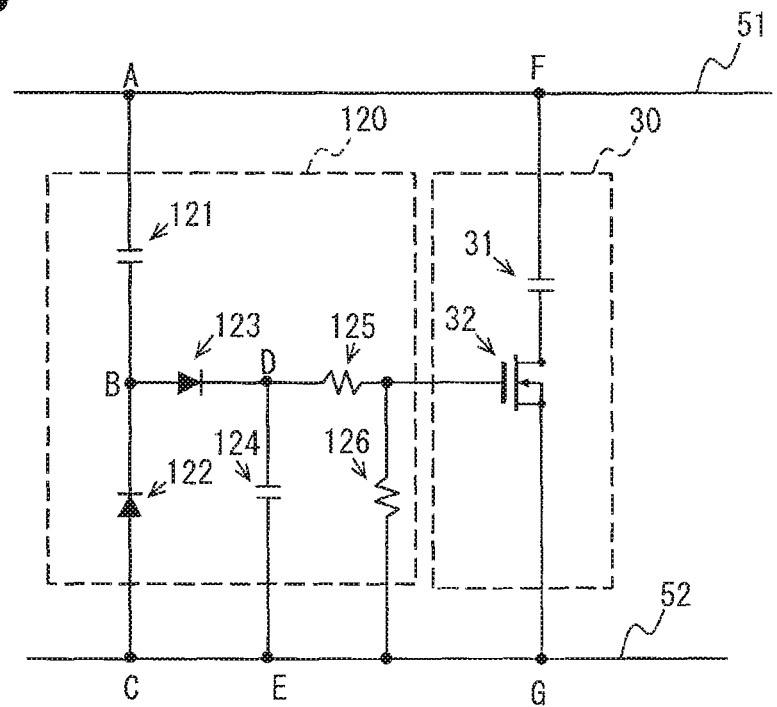
FIG. 5 is a diagram illustrating structures of a detection circuit and the resonance frequency shift circuit of an ECU according to a second embodiment.

As shown in FIG. 5, an ECU 1 of the second embodiment includes a detection circuit 120 and the resonance frequency shift circuit 30, which is the same as the first embodiment.

(Structure of Detection Circuit 120)

The detection circuit 120 has a capacitor 121, diodes 122, 123, a capacitor 124 and resistors 125, 126. The capacitor 121 has a first end connected to the power supply wiring 51, and a second end connected to a cathode terminal of the diode 122. An anode terminal of the diode 122 is connected to the ground terminal 52.

The diode 123 has an anode terminal connected to a point between the capacitor 121 and the cathode terminal of the diode 122, and a cathode terminal connected to the resistor 125.

The capacitor 124 has a first end connected to a point between the cathode terminal of the diode 123 and the resistor 125, and a second end connected to the ground wiring 52. The capacitor 124 corresponds to a first capacitor. A second end of the resistor 125, which is not connected to the cathode terminal of the diode 123, is connected to a gate terminal of the MOSFET 32. The resistor 125 may be same as the resistor 26 of the first embodiment.

The resistor 126 has a first end connected to a point between the resistor 125 and the gate terminal of the MOSFET 32 and a second end connected to the ground wiring 52.

(Operation of Detection Circuit 120)

The capacitor 121 functions as a coupling capacitor and allows a variation component of the voltage of the power supply wiring 51 to pass through. When the voltage of the power supply wiring 51 is higher than a DC voltage of the power supply wiring 51 due to the alternating noise superimposing on the power supply wiring 51, an electric current flows from the power supply wiring 51 to the ground wiring 52 through the capacitor 121, the diode 123, the capacitor 124, and thereby the capacitor 124 is charged.

The second end of the capacitor 121 adjacent to a point B has a voltage lower than a voltage of a point A by a potential difference of the capacitor 121. Therefore, when the voltage of the power supply wiring 51 is lower than the DC voltage of the power supply wiring 51, it is possible that the voltage of the second end of the capacitor 121 has a negative value. In this case, an electric current flows from the ground wiring 52 through the diode 122, and thereby the capacitor 121 is charged. When the voltage of the power supply wiring 51 increases to be higher than the DC voltage of the power supply wiring 51, the capacitor 124 is charged with a total voltage of a voltage charged by the capacitor 121 and an AC component of the voltage variation of the power supply wiring 51.

When the charged voltage of the capacitor 124 exceeds the transistor-on-voltage, the MOSFET 32 is turned on. An electrical charge charged in the capacitor 124 is continuously discharged through the resistor 126. The charged voltage of the capacitor 124 does not increase unless the amount of the electronic charge charged in the capacitor 124 is larger than the amount of the electronic charge discharged from the capacitor 124.

Although the charged voltage of the capacitor 124 does not increase to the transistor-on-voltage by one cycle of the noise, in the case that the noise includes the frequency components near the resonance frequency, the voltage variation occurring in the power supply wiring 51 is large and has a large frequency. Therefore, the amount of the electronic charge charged in the capacitor 124 is likely to be larger than the amount of the electronic charge discharged from the capacitor 124. Accordingly, in the case that the noise with the components near the resonance frequency occurs, the charged voltage of the capacitor 124 exceeds the transistor-on-voltage.

When the charged voltage of the capacitor 124 exceeds the transistor-on-voltage, the resonance frequency shift circuit 30 operates to shift the resonance frequency of the whole circuit network and decrease the voltage variation in the power supply wiring 51. As a result, the malfunction of the ECU 1 can be restricted.

Third Embodiment

Figure 6:
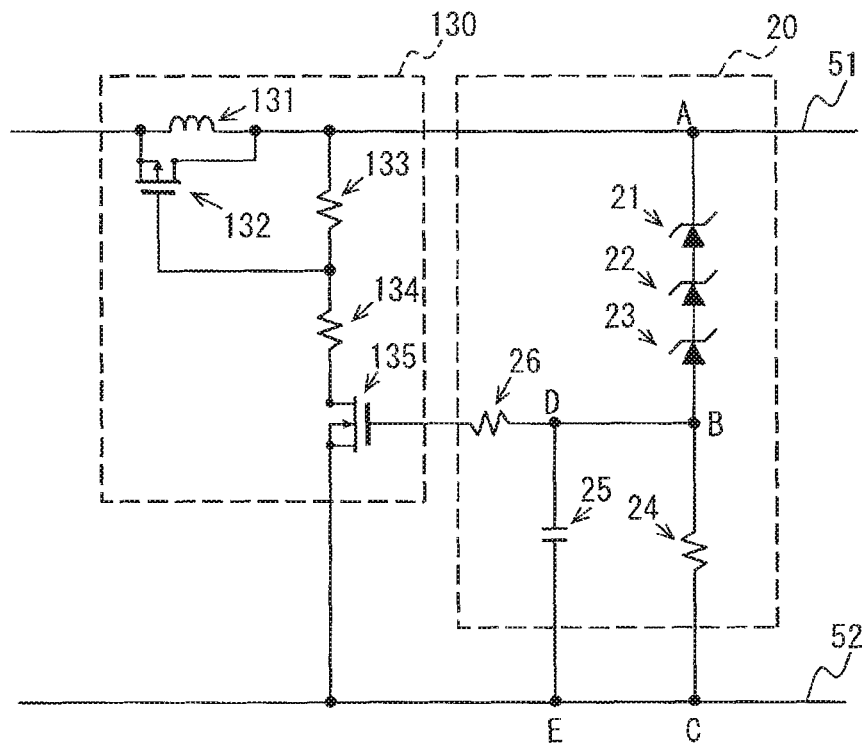
FIG. 6 is a diagram illustrating structures of the detection circuit and a resonance frequency shift circuit of an ECU according to a third embodiment.

As shown in FIG. 6, in the third embodiment, the ECU 1 includes the detection circuit 20, which is same as the first embodiment, and a resonance frequency shift circuit 130.

(Structure of Resonance Frequency Shift Circuit 130)

The resonance frequency shift circuit 130 has a coil 131, a MOSFET 132, resistors 133, 143 and a MOSFET 135. The coil 131 is connected to the power supply wiring 51 in series. The MOSFET 132 is a p-channel type transistor, and has a source terminal connected to the power supply wiring 51 upstream point of the coil 131, a drain terminal connected to the power supply wiring 51 downstream of the coil 131, and a gate terminal connected to a point between the resistor 133 and the resistor 134.

The resistors 133, 134 and the MOSFET 135 are connected in series. The resistor 133 has a first end connected to a point of the power supply wiring 51 downstream of a point to which the drain terminal of the MOSFET 132 is connected, and a second end connected to the resistor 134. A second end of the resistor 134, which is not connected to the resistor 133, is connected to a drain terminal of the MOSFET 135.

A gate terminal of the MOSFET 135 is connected to the resistor 26 of the detection circuit 20, and a ground terminal of the MOSFET 135 is connected to the ground wiring 52.

(Operation of the Resonance Frequency Shift Circuit 130)

When the MOSFET 135 is off, the MOSFET 132 is off and an electric current flows in the coil 131. When the charged voltage of the capacitor 25 increased and the MOSFET 135 is turned on, electric current flows from the power supply wiring 51 to the ground wiring 52 through the resistors 133, 134 and the MOSFET 135. Accordingly, a potential of a point between the resistor 133 and the resistor 134 decreases and the MOSFET 132 is turned off. In this case, an electronic current flows to the ground wiring 52 through the MOSFET 132. Therefore, the characteristic impedance of the whole circuit network is different from the value before the MOSFET 135 is turned on.

In the first embodiment and the second embodiment, the capacitor 31 is used to change the characteristic impedance. In the third embodiment, although the coil 131 is used to change the characteristic impedance, a point where the characteristic impedance changes is same.

When the resonance frequency shift circuit operates, the resonance frequency of the whole circuit network is shifted to decrease the voltage variation of the power supply wiring 51. Therefore, the malfunction of the ECU 1 can be restricted.

Fourth Embodiment

Figure 7:
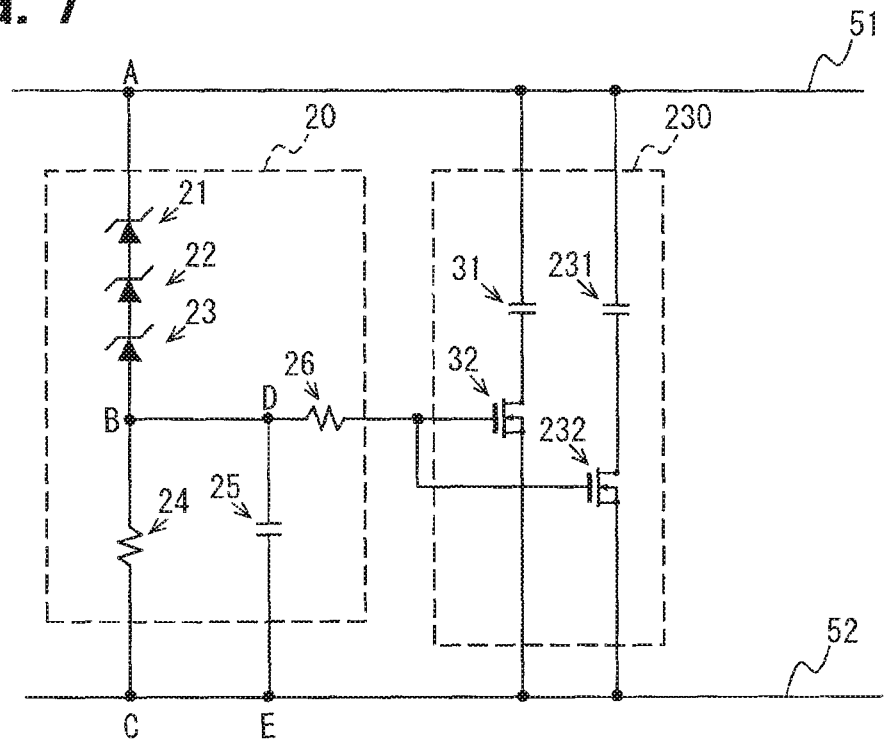
FIG. 7 is a diagram illustrating structures of the detection circuit and a resonance frequency shift circuit of an ECU according to a fourth embodiment.

In a fourth embodiment, as shown in FIG. 7, the electronic device has the detection circuit 20 same as the first embodiment, and a resonance frequency shift circuit 230.

The resonance frequency shift circuit 230 includes a capacitor 231 and a MOSFET 232 in addition to the capacitor 31 and the MOSFET 32 same as the first embodiment. The capacitor 231 and the MOSFET 232 are connected in series. The capacitor 231 has a first end connected to the power supply wiring 51 and a second end connected to a drain terminal of the MOSFET 232. The capacitor 231 corresponds to the second capacitor.

A source terminal of the MOSFET 232 is connected to the ground wiring 52, and a gate terminal of the MOSFET 232 is connected to the second end of the resistor 26, which is not connected to the capacitor 25. The capacitor 231 and the MOSFET 232 are connected to the capacitor 31 and the MOSFET 32 in parallel.

The MOSFET 232 has an on-voltage different from the on-voltage of the MOSFET 32. The MOSFETs 32 and 232 are turned on by the charged voltage of the capacitor 25. Since the MOSFETs 32 and 232 have different on-voltages, one having the lower on-voltage (MOSFET 32) is turned on prior to the other having the higher on-voltage. Accordingly, the resonance frequency is shifted to decrease the voltage variation of the power supply wiring 51 caused by the noise with components near the resonance frequency before the shift.

However, in the case where the noise includes components near the shifted resonance frequency even after the shift of the resonance frequency, the voltage variation will occur in the power supply wiring 51 and the voltage of the power supply wiring 51 exceeds the total breakdown voltage. In this case, the capacitor 25 is continued to be charged and the charged voltage of the capacitor 25 increases. When the charged voltage of the capacitor 25 increases to be higher than the on-voltage of the MOSFET 232, the MOSFET 232 is turned on. Therefore, the resonance frequency is further shifted.

In the fourth embodiment, the malfunction of the ECU 1 can be restricted in a case where the noise includes the component near the resonance frequency of the circuit network in which the MOSFETs 32 and 232 are turned off, and the component near the resonance frequency of the circuit network in which only the MOSFET 32 is turned on.

Fifth Embodiment

Figure 8:
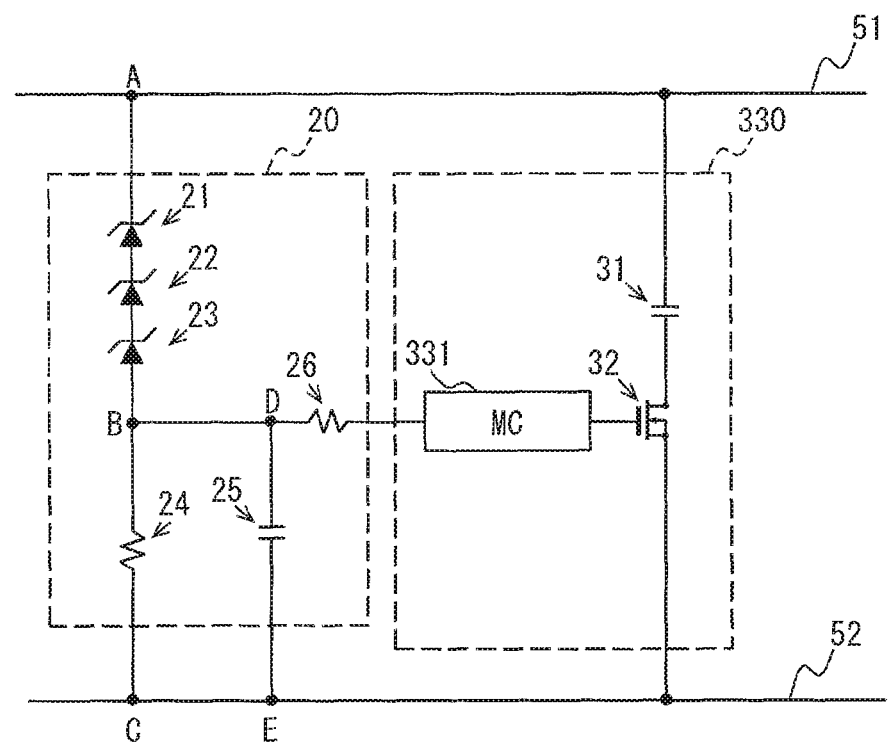
FIG. 8 is a diagram illustrating structures of the detection circuit and a resonance frequency shift circuit of an ECU according to a fifth embodiment.

In the fifth embodiment, as shown in FIG. 8, the electronic device has the detection circuit 20 same as the first embodiment, and a resonance frequency shift circuit 330.

The resonance frequency shift circuit 330 includes the capacitor 31 and the MOSFET 32, similar to the resonance frequency shift circuit 30 of the first embodiment. The resonance frequency shift circuit 330 further includes a microcomputer 331 functioning as a maintenance circuit.

Figure 9:
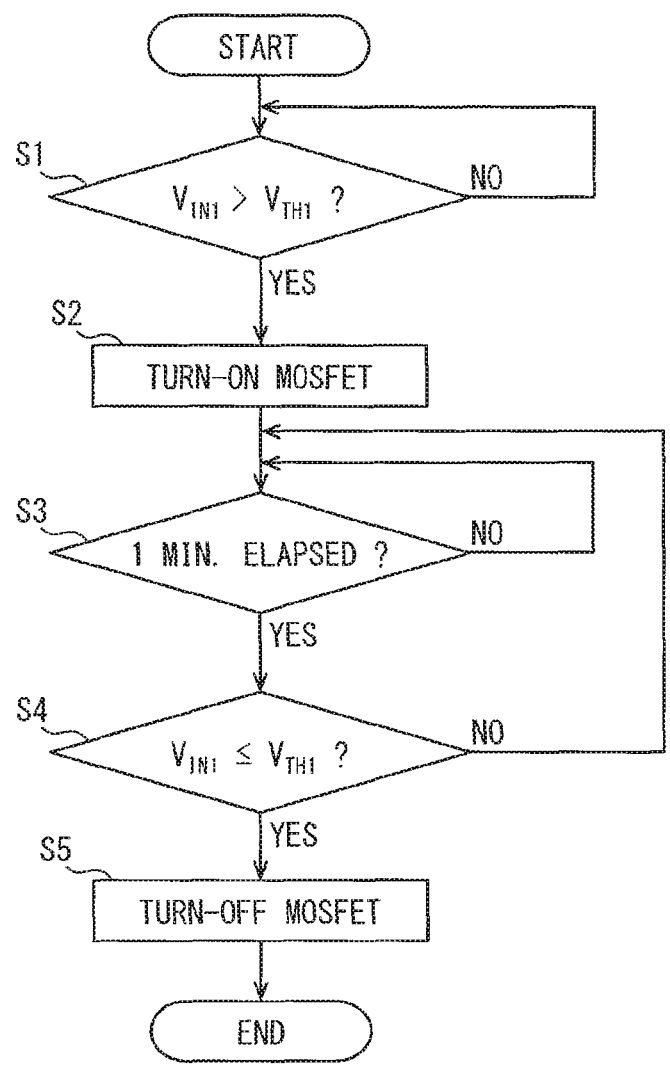
FIG. 9 is a flowchart illustrating a processing executed by a microcomputer of FIG. 8.

The microcomputer 331 periodically executes a processing shown in FIG. 9. At S1, whether an input voltage $V_{IN1}$ is higher than a threshold voltage $V_{TH1}$ is determined. When the determination indicates NO, S1 is repeated.

When the determination at S1 indicates YES, the processing proceeds to S2. At S2, the MOSFET 32 is turned on. When the MOSFET 32 is turned on, the resonance frequency is shifted.

At S3, it is determined whether one minute has elapsed since the MOSFET 32 is turned on. When the determination indicates NO, the processing is repeated at S3. When the determination at S3 indicates YES, the processing proceeds to S4.

At S4, whether the input voltage $V_{IN1}$ is equal to or lower than the threshold voltage $V_{TH1}$ is determined. When the determination indicates NO, the processing returns to S3. Therefore, when the input voltage $V_{IN1}$ one minute after the MOSFET 32 being turned on at S2 is higher than the threshold voltage, the MOSFET 32 is kept on for further one minute. Alternatively, when the determination at S4 indicates NO, the processing may be repeated at S4.

When the determination at S4 indicates YES, the processing proceeds to S5. At S5, the MOSFET 32 is turned off.

In the fifth embodiment, when the microcomputer 331 determined that the input voltage $V_{IN1}$ is higher than the threshold voltage $V_{TH1}$, the microcomputer keeps a state where the resonance frequency is shifted for one minute, regardless of the variation of the charged voltage of the capacitor 25. Therefore, on and off of the MOSFET 32 are less likely to be changed frequently. One minute is an example, and the MOSFET 32 may be turned on for more than or less than one minute.

Sixth Embodiment

Figure 10:
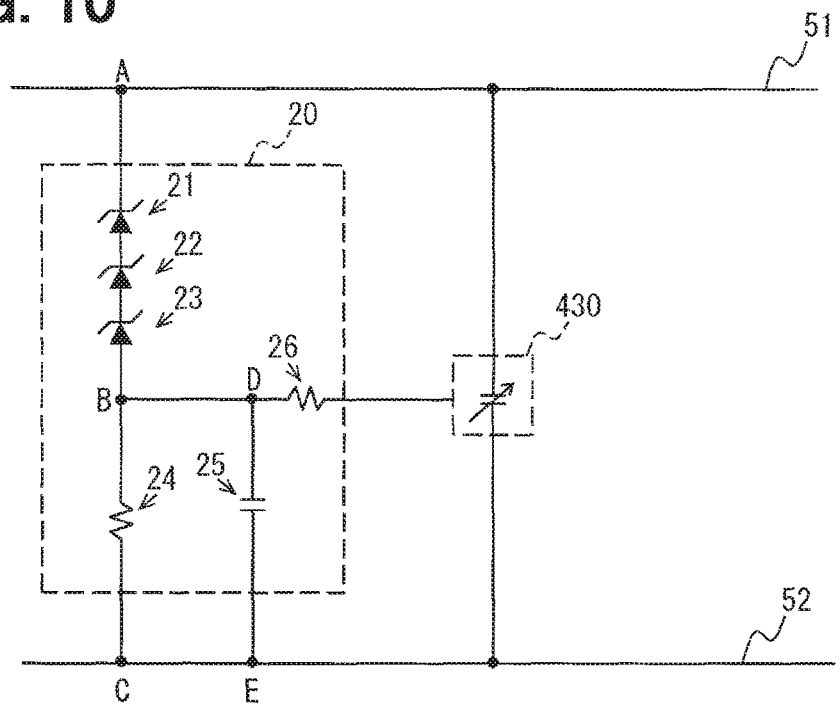
FIG. 10 is a diagram illustrating structures of the detection circuit and a variable capacitor as a frequency shift circuit of an ECU according to a sixth embodiment.

In the sixth embodiment, as shown in FIG. 10, the electronic device has the detection circuit same as the first embodiment, and a variable capacitor 430 functioning as the resonance frequency circuit. The variable capacitor 430 receives the charged voltage of the capacitor 25 through the resistor 26.

An electrostatic capacity of the variable capacitor 430 is changed continuously in accordance with the charged voltage of the capacitor 25. Since the variable capacitor 430 is connected to the power supply wiring 51 and the ground wiring 52, when the electrostatic capacity of the variable capacitor 430 is changed continuously, the resonance frequency of the whole circuit network is shifted continuously.

When the noise includes the components near the resonance frequency, large voltage variation occurs in the power supply wiring 51 due to the resonance and the charged voltage of the capacitor 25 increases continuously. Accordingly, the electrostatic capacity of the variable capacitor 430 is changed continuously to shift the resonance frequency of the whole circuit network continuously.

Therefore, the resonance frequency of the whole circuit network is shifted continuously until the resonance frequency does not include the frequency of the noise. As a result, in the sixth embodiment, the malfunction of the ECU 1 can be restricted when the noise includes broad range of frequencies.

Seventh Embodiment

Figure 11:
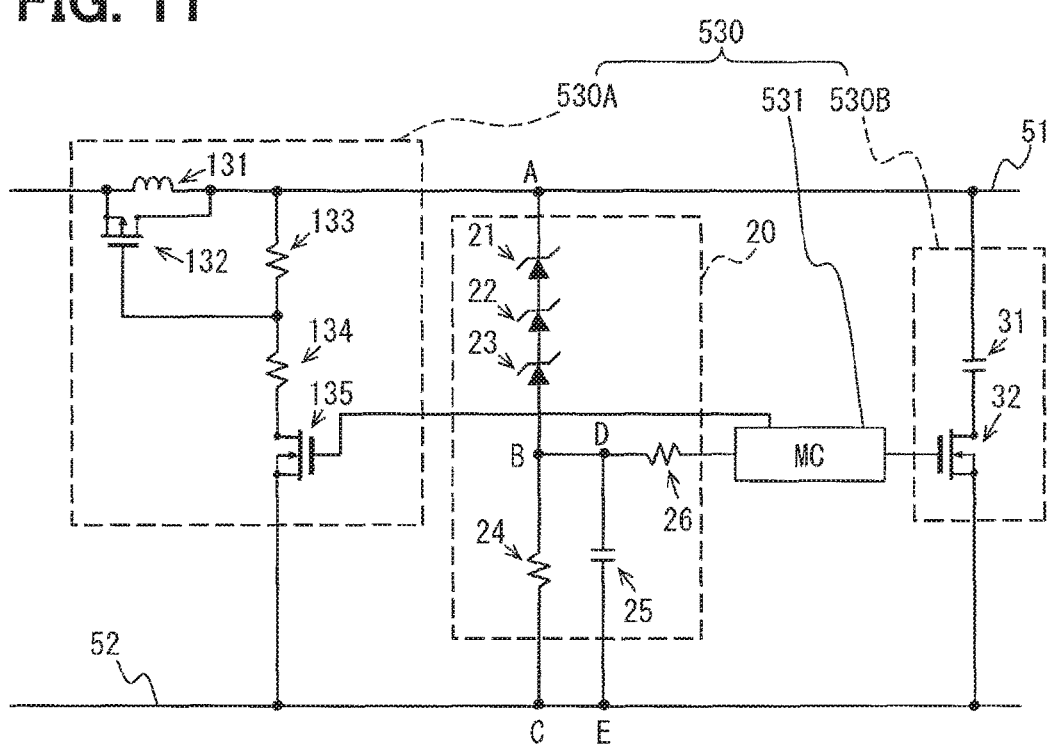
FIG. 11 is a diagram illustrating structures of the detection circuit and a resonance frequency shift circuit of an ECU according to a seventh embodiment.

In the seventh embodiment, as shown in FIG. 11, the electronic device has the detection circuit 20 same as in the first embodiment, and a resonance frequency shift circuit 530. The resonance frequency shift circuit 530 includes a first resonance frequency shift circuit 530A, a second resonance frequency shift circuit 530B and a microcomputer 531.

The first resonance frequency shift circuit 530A includes the coil 131, the MOSFET 132, the resistors 133, 134 and the MOSFET 135, similar to the resonance frequency shift circuit 130 of the third embodiment. The gate terminal of the MOSFET 135 receives a signal transmitted from the microcomputer 531. Other structures are same as the resonance frequency shift circuit 130.

The second resonance frequency shift circuit 530B includes the capacitor 31 and the MOSFET 32, similar to the resonance frequency shift circuit 30 of the first embodiment. The gate terminal of the MOSFET 32 receives a signal transmitted from the microcomputer 531. Other structures are same as the resonance frequency shift circuit 30.

Figure 12:
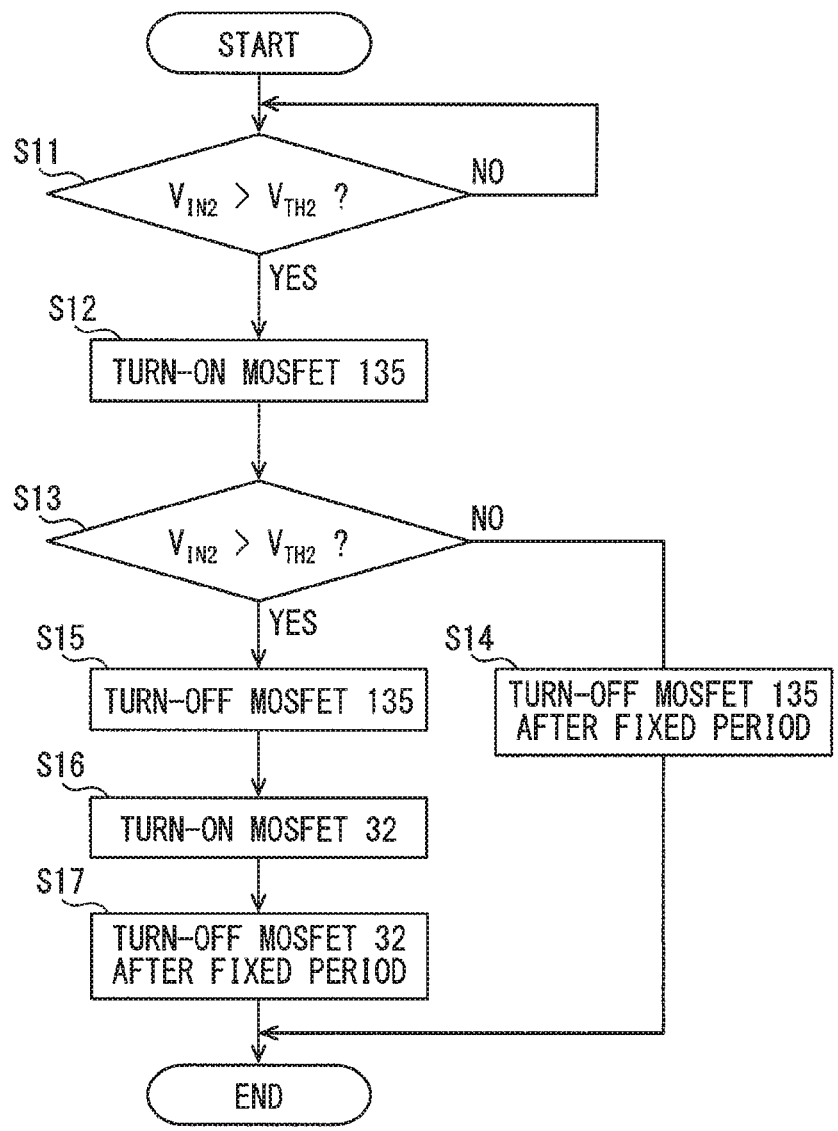
FIG. 12 is a flowchart illustrating a processing executed by a microcomputer of FIG. 11.

In the seventh embodiment, the microcomputer 531 executes a processing shown in FIG. 12 periodically. At S11, whether an input voltage $V_{IN2}$ is higher than a threshold voltage $V_{TH2}$ is determined. The input voltage $V_{IN2}$ is voltage received by the microcomputer 531. When the determination indicates NO, the processing is repeated at S11.

When the determination at S11 indicates YES, the processing proceeds to S12. At S12, the MOSFET 135 is turned on. When the MOSFET 135 is turned on, the MOSFET 132 is turned on. Accordingly, an electric current flowing in the coil 131 flows in the MOSFET 132. Therefore, an inductance of a circuit network is decreased, and a resonance frequency of the circuit network is shifted to be a relatively higher value.

At S13, whether the input voltage $V_{IN2}$ is higher than the threshold voltage $V_{TH2}$ is determined again. When the voltage variation of the power supply wiring 51 is decreased because of the resonance frequency changed to be higher, the determination indicates NO. In this case, the processing proceeds to S14. At S14, the MOSFET 135 is turned off after a fixed period has elapsed. Although the fixed period can be set arbitrarily, the fixed period is, for example, one minute.

When a noise includes component of the resonance frequency that is shifted and the voltage variation of the power supply wiring 51 is not sufficiently decreased, the determination as S13 indicates YES. In this case, the MOSFET 135 is turned off at S15 and the MOSFET 32 is turned on as S16 in order to decrease the resonance frequency to be relatively lower than the resonance frequency before S12. At S17, the MOSFET 32 is turned off after fixed period.

In the seventh embodiment, when the input voltage $V_{IN2}$ is higher than the threshold voltage $V_{TH2}$, the resonance frequency is increased (S12). When the input voltage $V_{IN2}$ is still higher than the threshold voltage $V_{TH2}$ (S13: YES), the resonance frequency is decreased to be lower than the resonance frequency before being increased (S15, S16). As such, the voltage variation of the power supply wiring 51 can be restricted and the malfunction of the ECU 1 can be restricted.

Eighth Embodiment

Figure 13:
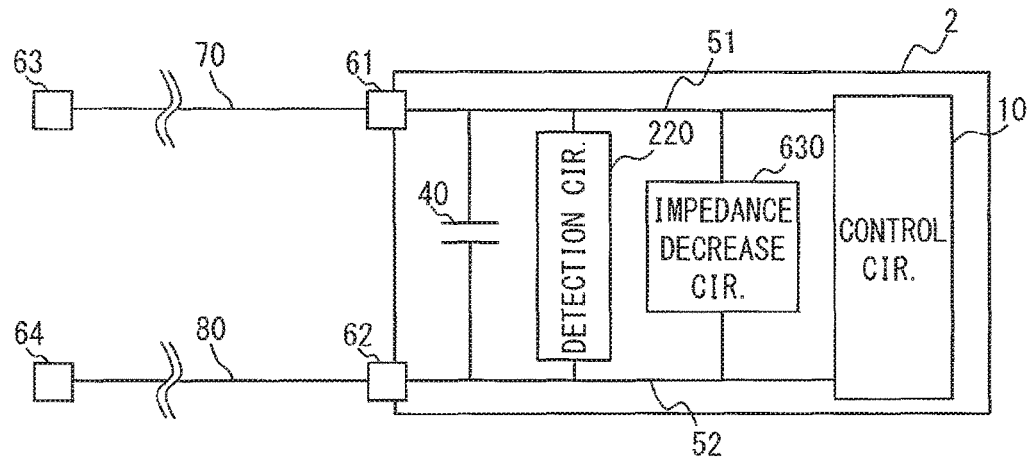
FIG. 13 is a schematic block diagram of an ECU according to an ECU according to an eighth embodiment of the present disclosure.

FIG. 13 illustrates a schematic block diagram of an ECU 2 according to an eighth embodiment of an electronic device of the present disclosure.

(Overall Structure)

As shown in FIG. 13, the ECU 2 has a control circuit 10, a detection circuit 220, an impedance decrease circuit 630, a capacitor 40 and terminals 61, 62. The terminals 61, 62 are connected to ends of wire harnesses 70, 80. Opposite ends of the wire harnesses 70, 80 are connected to terminals 63, 64. In the present embodiment, the terminal 63 is connected to a vehicle battery, and the terminal 64 is connected to the ground. Therefore, the ECU 2 receives a power through the wire harnesses 70, 80. Hereinafter, a circuit network in the ECU 2 is referred to as an ECU circuit network, and a circuit network including the wire harnesses 70, 80 and the ECU 2 is referred to as a whole circuit network.

In the ECU 2, the terminal 61 is connected to one end of a power supply wiring 51, and the terminal 62 is connected to one end of a ground wiring 52.

The capacitor 40 has a first end connected to the power supply wiring 51, and a second end connected to the ground wiring 52. The capacitor 40 smooths an electric current flowing in the power supply wiring 51.

The power supply wiring 51 is connected to the control circuit 10, the detection circuit 220 and the impedance decrease circuit 630. The ground wiring 52 is connected to the control circuit 10, the detection circuit 220 and the impedance decrease circuit 630.

The control circuit 10 executes a predetermined control, and is at least one of a digital circuit, an analog circuit and a circuit combining the digital circuit and the analog circuit. The control executed by the control circuit 10 is not especially limited. For example, the control circuit 10 controls an in-vehicle motor, which is not illustrated.

The detection circuit 220 detects a voltage variation occurring in the power supply wiring 51 and being caused by noise superimposing on the wire harness 70 or the ECU circuit network. A concrete structure of the detection circuit 220 will be described later with reference to FIG. 15.

The impedance decrease circuit 630 decreases an impedance of the whole circuit network as a protection operation protecting the control circuit 10, when a level of the voltage variation detected by the detection circuit 220 is equal to or higher than a predetermined level. A concrete structure of the impedance decrease circuit 630 will be described later with reference to FIG. 15.

Figure 14:
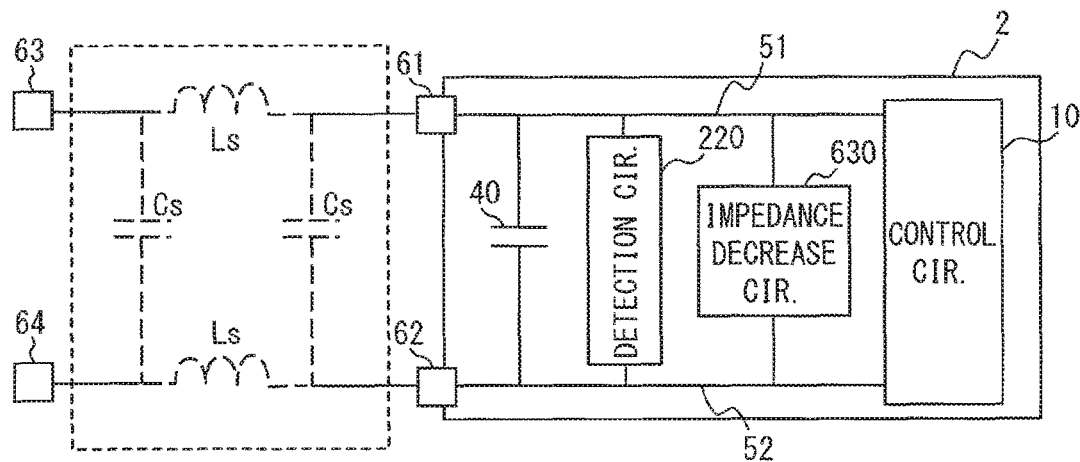
FIG. 14 is a diagram conceptually illustrating parasitic capacitances and parasitic inductances of the wire harnesses of FIG. 13.

As conceptually shown FIG. 14, the wire harnesses 70, 80 connected to the ECU 2 have parasitic capacitances Cs and parasitic inductances Ls. The wire harnesses 70, 80 have different length and different distance to body earth depending on the type of vehicle. Therefore, characteristic impedances of the wire harnesses 70, 80 differ depending on the type of vehicle.

Since the characteristic impedances of the wire harnesses 70, 80 differ depending on the type of vehicle, a characteristic impedance of the whole circuit network differs depending on the type of vehicle. Therefore, a resonance frequency $f_0$ of the whole circuit network, which is determined based on the characteristic impedance, differs depending on the type of vehicle.

When a frequency component of the noise superimposing on the wire harnesses 70, 80 or the ECU circuit network is near the resonance frequency of the whole circuit network, a large voltage variation will occur in the whole circuit network.

Generally, the ECU 2 is examined before being equipped to a vehicle by an immunity test executed in a predetermined method. Since the immunity test is executed before the ECU 2 is equipped to the vehicle, it is difficult to consider the characteristic impedances of the wire harnesses 70, 80, which differ depending on the type of vehicle. Therefore, even when countermeasures are made for noise, which has a frequency component near a resonance frequency based on characteristic impedances under a condition of the immunity test, there is a possibility that the malfunction of the ECU 2 cannot be restricted when being equipped to the vehicle.

In the present embodiment, the detection circuit 220 and the impedance decrease circuit 630 enhance an immunity of the electronic device. Specifically, the detection circuit 220 and the impedance decrease circuit 630 have the structures shown in FIG. 15.

(Structure of Detection Circuit 220)

Figure 15:
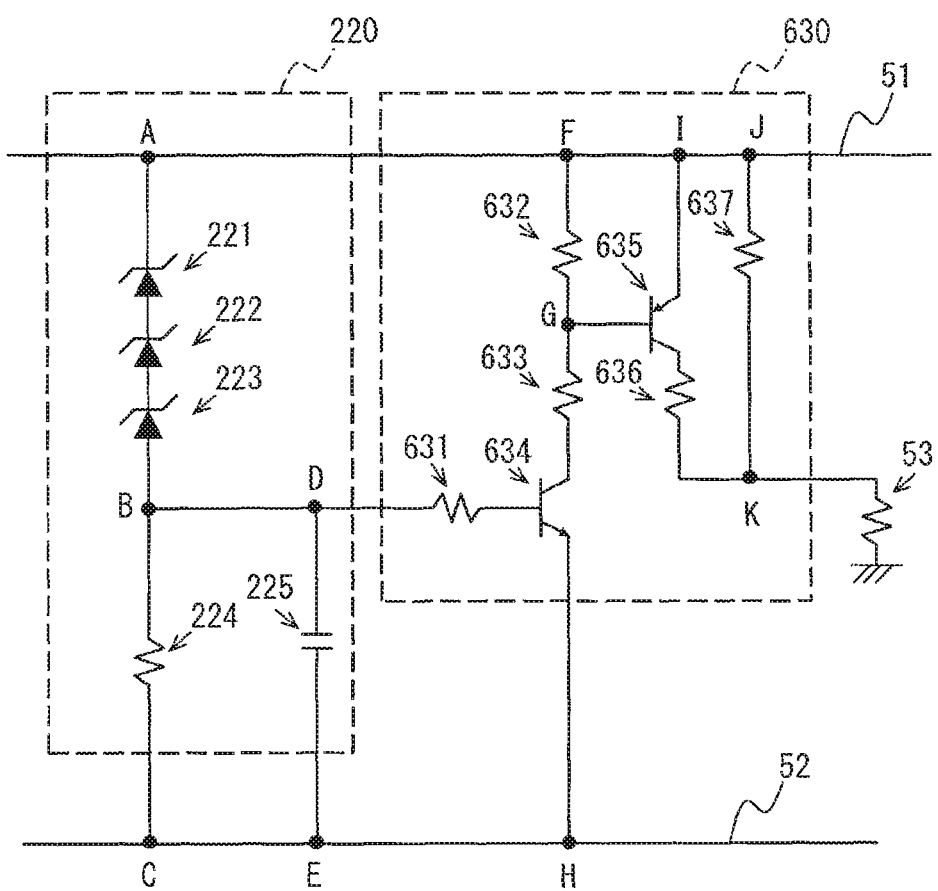
FIG. 15 is a diagram illustrating structures of a detection circuit and an impedance decrease circuit of FIG. 13.

As shown in FIG. 15, the detection circuit 220 has three Zener diodes 221 to 223, a resistor 224 and a capacitor 225. The three Zener diodes 221 to 223 and the resistor 224 are connected in series in this order. A first end of the Zener diode 221 is connected to the power supply wiring 51 and a second end of the resistor 24 is connected to the ground wiring 52.

The capacitor 225 is connected to the resistor 224 in parallel. The capacitor 225 has a first end connected to a point between the Zener diode 223 and the resistor 224, and a second end connected to the ground wiring 52.

The Zener diodes 221 to 223 have cathode terminals toward the power supply wiring 51. The Sum of breakdown voltages of the three Zener diodes 221 to 223 is hereinafter referred to as a total breakdown voltage. The total breakdown voltage is set such that voltage of the power supply wiring 51 can exceed the total breakdown voltage when the noise with the frequency component near the resonance frequency superimposes on the whole circuit network and when the large voltage variation occurs in the power supply wiring 51. When power supply voltage is 12V, for example, the total breakdown voltage is from 24 V to 30 V.

(Structure of Impedance Decrease Circuit 630)

The impedance decrease circuit 630 is connected to the power supply wiring 51 and the ground wiring 52. As shown in FIG. 15, the impedance decrease circuit 630 has resistors 631, 632, 633, transistors 634, 635 and resistors 636, 637.

The resistor 631 has a first end connected to the first end of the capacitor 225, which is not connected to the ground wiring 52, and a second end connected to a base terminal of the transistor 634.

The two resistors 632, 633 are connected in series. A second end of the resistor 632 is connected to a first end of the resistor 633. A first end of the resistor 632, which is not connected to the resistor 633, is connected to the power supply wiring 51. A second end of the resistor 633, which is not connected to the resistor 632, is connected to a collector terminal of the transistor 634. These resistors 632, 633 correspond to series resistors.

The transistor 634 is an NPN-type bipolar transistor. The transistor has the collector terminal connected to the resistor 633, an emitter terminal connected to the ground wiring 52, and the base terminal connected to the resistor 631.

The transistor 635 is a PNP-type bipolar transistor. The transistor 635 has an emitter terminal connected to power supply wiring 51, and base terminal connected to a point G between the resistors 632 and 633, and a collector terminal connected to the resistor 636.

The resistors 636 and 637 are connected in parallel. A second end of the resistor 636 is connected to a second end of the resistor 637. A first end of the resistor 637, which is not connected to the resistor 636, is connected to the power supply wiring 51. The second end of the resistor 636 and the second end of the resistor 637, which are not connected to the power supply wiring 51, are connected to the ground through a terminal resistor 53.

(Operation of Detection Circuit 220)

Next, an operation of the detection circuit 220 will be described. When the voltage of the power supply wiring 51 exceeds the total breakdown voltage, an electric current flows as follows: A→B→D→E. The capacitor 225 is charged with the electric current.

Voltage at a point D increases as the capacitor 225 is charged. An electric current flowing through the resistor 631 and flowing into the base terminal of the transistor 634 increases as the voltage at the point D increases. Then, the transistor 634 is turned on when charged voltage of the capacitor 225 exceeds a predetermined voltage capable of turning on the transistor 634 (hereinafter, referred to as a transistor-on-voltage). The transistor-on-voltage corresponds to a circuit operating voltage. When the transistor 634 is turned on, an electric current flows from the capacitor 225 to the transistor 634 and the charged voltage of the capacitor 225 decreases.

Even when the transistor 634 is not turned on, an electric current flows from the capacitor 225 to the point D, a point B and a point C and the charged voltage of the capacitor 225 decreases. When the noise has an alternating current component, however, two states of the voltage of the power supply wiring 51 are repeated, one being a state where the voltage of the power supply wiring 51 is higher than the total breakdown voltage, the other being a state where the voltage of the power supply wiring 51 is lower than the total breakdown voltage. Even when the amount of voltage charged by one cycle of the noise is small, in a case where the voltage of the power supply wiring 51 exceeds the total breakdown voltage repeatedly, the charged voltage of the capacitor 225 reaches the transistor-on-voltage.

Therefore, the charged voltage of the capacitor 225 indicates magnitude of the voltage of the power supply wiring 51 exceeding the total breakdown voltage due to the noise and duration of the noise. In other words, the detection circuit 220 detects whether magnitude and duration of voltage variation in the power supply wiring 51 caused by the noise are equal to or more than level where the charged voltage of the capacitor 225 exceeds the transistor-on-voltage.

When the voltage of the power supply wiring 51 exceeds the total breakdown voltage, the capacitor 225 is charged regardless of the frequency component of the noise. When the frequency of the noise includes a frequency component near the resonance frequency of the whole circuit network, the voltage of the power supply wiring 51 are likely to exceed the total breakdown voltage. Therefore, the detection circuit 220 mainly detects noise with a frequency component near the resonance frequency of the whole circuit network.

(Operation of Impedance Decrease Circuit 630)

Next, the operation of the impedance decrease circuit 630 will be described. The impedance decrease circuit 630 operates when the transistor 634 is turned on, that is, when the charged voltage of the capacitor 225 is equal to the transistor-on-voltage. Base potential of the transistor 634 when the transistor 634 is not on is pulled-down to the ground through the resistor 631 and the resistor 224.

When the transistor 634 is turned on, electric current flows in a line FH between a point F and a point H, and the PNP-type transistor 635 is turned on. When the transistor 635 is turned on, electric current flows in the resistor 636, which is connected to the resistor 637 in parallel, and impedance in a line IK between a point I and a point K decreases. Since voltage in the line IK decreases due to the decrease of the impedance, the voltage of the power supply wiring 51 including a line IJ between the point I and a point J, which is a part of the line IK decreases.

(Advantageous Effects of Eighth Embodiment)

Figure 16A:
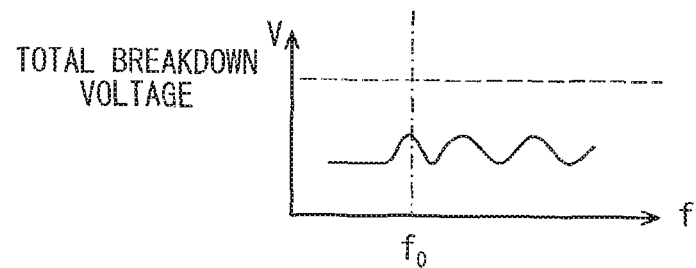
FIGS. 16A to 16C are diagrams illustrating effects of the eighth embodiment.
Figure 16B:
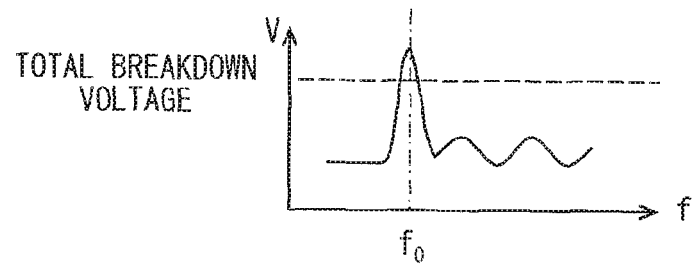

Effects of the eighth embodiment will be described with reference to FIG. 16. FIG. 16A illustrates an example of noise superimposing on the wire harness 70 or the power supply wiring 51. The noise shown in FIG. 16A includes a component of the resonance frequency $f_0$. Voltage of frequency components near the resonance frequency $f_0$ does not exceed the total breakdown voltage as well as the other frequency components of the other frequencies.

Since the noise includes the components near the resonance frequency $f_0$, voltage variation of the components in a state where the resonance occurs is much larger than voltage variation of the components in a state where the resonance does not occur. As a result, in FIG. 16B, the voltage of the components near the resonance frequency $f_0$ exceeds the total breakdown voltage.

The ECU 2 of the present embodiment has the detection circuit 220. The detection circuit 220 has the capacitor 225, which is charged when the voltage of the power supply wiring 51 exceeds the total breakdown voltage. When the charged voltage of the capacitor 225 exceeds the transistor-on-voltage, the transistor 634 is turned on, and the impedance decrease circuit 630 operates.

That is, the detection circuit 220 detects the voltage variation occurring in the power supply wiring 51. Although the resonance frequency $f_0$ is shifted depending on the type of vehicle to which the ECU 2 is equipped, the detection circuit 220 can detect the noise with the component of the resonance frequency $f_0$ and the components near the resonance frequency $f_0$.

Figure 16C:
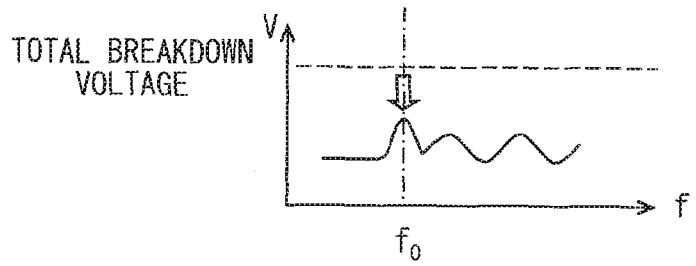

When the impedance decrease circuit 630 operates, the impedance of the whole circuit network is decreased. As a result, as shown in FIG. 16C, the voltage variation of the components near the resonance frequency $f_0$ is small. Since the voltage variation of the components near the resonance frequency $f_0$ is small, the voltage of the power supply wiring 51 is decreased to be equal to or less than the total breakdown voltage.

When the voltage variation occurring in the power supply wiring 51 is larger than that assumed in the design in the design of the ECU 2, the impedance decrease circuit 630 operates to decrease the impedance of the whole circuit network. Therefore, the malfunction of the ECU 2 can be restricted.

In the present embodiment, since the impedance decrease circuit 630 operates using the charged voltage of the capacitor 225, another power source is not required different from a case using the microcomputer or the like. Therefore, the present disclosure is suitable for a case where standby electricity consumption is preferable to be decreased, for example where the vehicle is parked.

When a condition where the voltage of the power supply wiring 51 is equal to or lower than the total breakdown voltage is continued, the charged voltage of the capacitor 225 is decreased to be lower than the transistor-on-voltage, and the impedance decrease circuit 630 is turned off.

Ninth Embodiment

Next, ninth embodiment will be described. In the following description, unless especially mentioned, an element having the same symbol as a symbol being used in the previous embodiment is same as an element being described in the previous embodiment.

Figure 17:
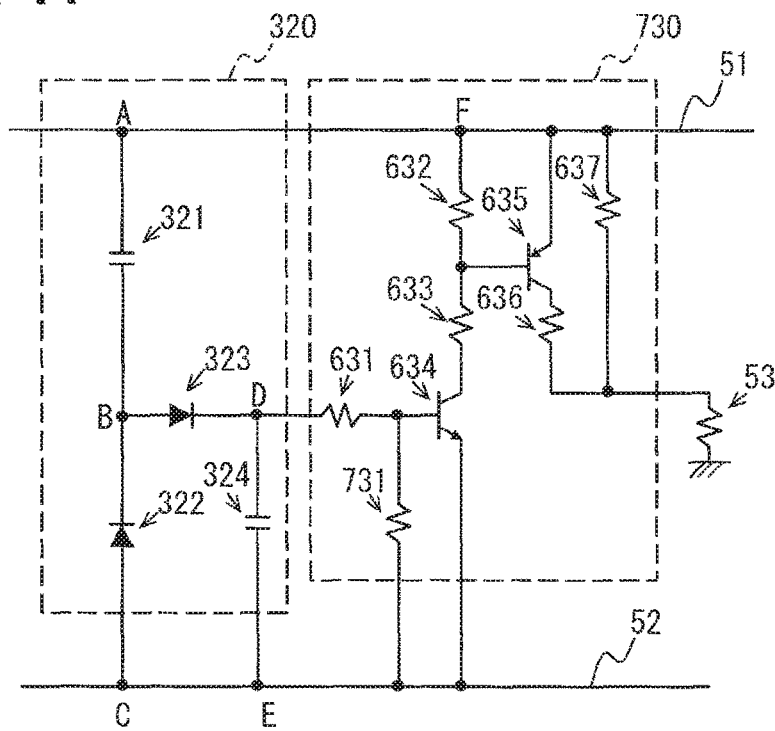
FIG. 17 is a diagram illustrating structures of a detection circuit and an impedance decrease circuit of an ECU according to a ninth embodiment.

FIG. 17 illustrates structures of detection circuit 320 and impedance decrease circuit 730 of the ninth embodiment. As shown in FIG. 17, the ninth embodiment has different structures of the detection circuit 320 and the impedance decrease circuit 730 from the eighth embodiment.

(Structure of Detection Circuit 320)

The detection circuit 320 has a capacitor 321, diodes 322, 323, and a capacitor 324. The capacitor 321 has a first end connected to the power supply wiring 51, and a second end connected to a cathode terminal of the diode 322. An anode terminal of the diode 322 is connected to the ground wiring 52.

The diode 323 has an anode terminal connected to a point between the capacitor 321 and the cathode terminal of the diode 322, and a cathode terminal connected to a resistor 631 of the impedance decrease circuit 730.

The capacitor 324 has a first end connected to a point between the cathode terminal of the diode 323 and the resistor 631 of the impedance decrease circuit 730, and a second end connected to the ground wiring 52.

(Structure of Impedance Decrease Circuit 730)

The impedance decrease circuit 730 is similar to the impedance decrease circuit 630 of the eighth embodiment except for a point that a resistor 731 is added. The resistor 731 has a first end connected to a point between the resistor 631 and the base terminal of the transistor 634, and a second end connected to the ground wiring 52.

(Operation of Detection Circuit 320 and Impedance Decrease Circuit 730)

The capacitor 321 functions as a coupling capacitor and allows a variation component of the voltage of the power supply wiring 51 to pass through. When the voltage of the power supply wiring 51 is higher than a DC voltage of the power supply wiring 51 due to the alternating noise superimposing on the power supply wiring 51, an electric current flows from the power supply wiring 51 to the ground wiring 52 through the capacitor 321, the diode 323, the capacitor 324, and thereby the capacitor 324 is charged.

The second end of the capacitor 321 adjacent to a point B has a voltage lower than a voltage of a point A by a potential difference of the capacitor 321. Therefore, when the voltage of the power supply wiring 51 is lower than the DC voltage of the power supply wiring 51, it is possible that the voltage of the second end of the capacitor 321 has a negative value. In this case, an electric current flows from the ground wiring 52 through the diode 322, and thereby the capacitor 321 is charged. When the voltage of the power supply wiring 51 increases to be higher than the DC voltage of the power supply wiring 51, the capacitor 324 is charged with a total voltage of a voltage charged by the capacitor 321 and an AC component of the voltage variation of the power supply wiring 51.

When the charged voltage of the capacitor 324 exceeds the transistor-on-voltage, the transistor 634 is turned on. The base voltage in the state where the transistor 634 is not on is pulled-down to the ground by the resistor 731.

Although the charged voltage of the capacitor 324 does not increase to be higher than the transistor-on-voltage by one cycle of the noise, when the frequency of the noise includes the components near the resonance frequency, the voltage variation in the power supply wiring 51 is large and has a large frequency. Therefore, the amount of the charged voltage of the capacitor 324 is larger than the amount of the discharged voltage of the capacitor 324. Accordingly, when the noise with the components near the resonance frequency occurs, the charged voltage of the capacitor 324 exceeds the transistor-on-voltage.

When the charged voltage of the capacitor 324 exceeds the transistor-on-voltage, the impedance decrease circuit 730 is turned on to decrease the impedance of the whole circuit network. Therefore, the malfunction of the ECU 2 can be restricted.

Tenth Embodiment

Figure 18:
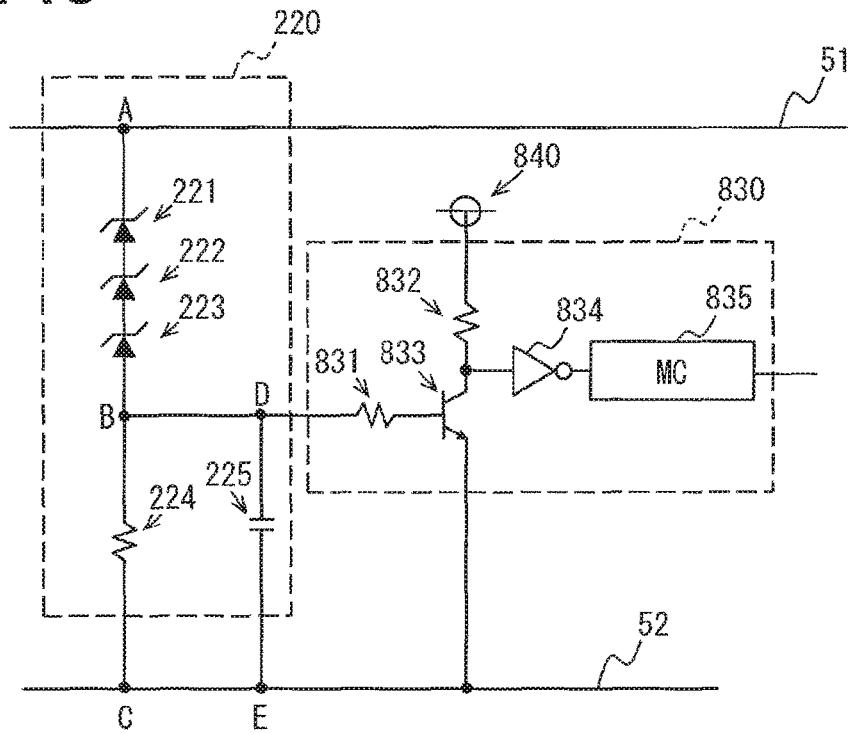
FIG. 18 is a diagram illustrating structures of the detection circuit and a protection circuit of an ECU according to a tenth embodiment.

In a tenth embodiment, as shown in FIG. 18, the electronic device has the detection circuit 220 same as the eighth embodiment, and a protection circuit 830.

The protection circuit 830 includes resistors 831, 832, a transistor 833, an inverter 834 and a microcomputer 835. Similar to the resistor 631 of the eighth embodiment, the resistor 831 has a first end connected to the first end of the capacitor 225, which is not connected to the ground wiring 52, and a second end connected to a base terminal of the transistor 833.

The resistor 832 has a first end connected to an internal power source 840, and a second end connected to a collector terminal of the transistor 833.

The transistor 833 may be the same transistor as the transistor 634 of the eighth and the ninth embodiment. The transistor 833 has the base terminal connected to the resistor 831, and an emitter terminal connected to the ground wiring 52.

The inverter 834 receives a potential between the resistor 831 and the collector terminal of the transistor 833. The inverter 834 has an output terminal connected to the microcomputer 835. When the transistor 833 is turned off, an input voltage of the inverter 834 is equal to a voltage of the internal power source 840, so the inverter 834 outputs a low signal. When the transistor 833 is turned on and the input voltage of the inverter 834 decreases, the inverter 834 outputs a high signal.

The microcomputer 835 corresponds to a function suspension circuit. When the microcomputer 835 receives the high signal from the inverter 834, the microcomputer 835 transmits a signal to suspend a function to the control circuit 10.

As such, the malfunction of the ECU 2 can be restricted by suspending the function of the control circuit 10 when the transistor 833 is turned on.

Eleventh Embodiment

Figure 19:
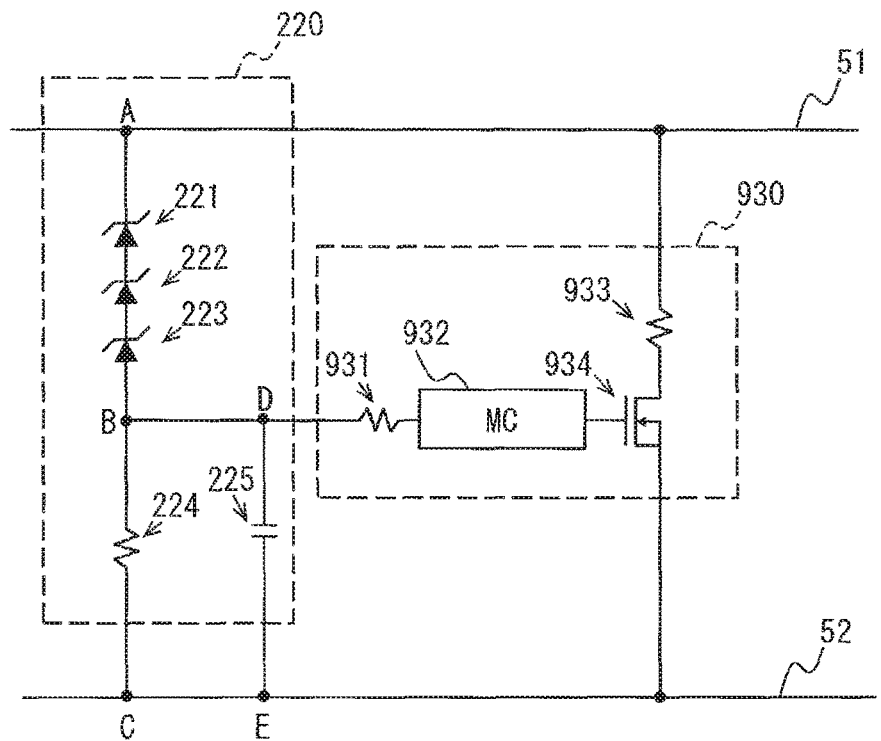
FIG. 19 is a diagram illustrating structures of the detection circuit and an impedance decrease circuit of an ECU according to an eleventh embodiment.

In an eleventh embodiment, as shown in FIG. 19, the electronic device has the detection circuit 220 same as the eighth embodiment, and an impedance decrease circuit 930.

The impedance decrease circuit 930 includes a resistor 931, a microcomputer 932, a resistor 933 and a MOSFET 934. The microcomputer 932 has an output terminal connected to a gate terminal of the MOSFET 934. The resistor 933 has a first end connected to the power supply wiring 51, and a second end connected to a drain terminal of the MOSFET 934. The resistor 933 corresponds to a series resistor. The MOSFET 934 is an n-channel type transistor, and has a source terminal connected to the ground wiring 52.

Figure 20:
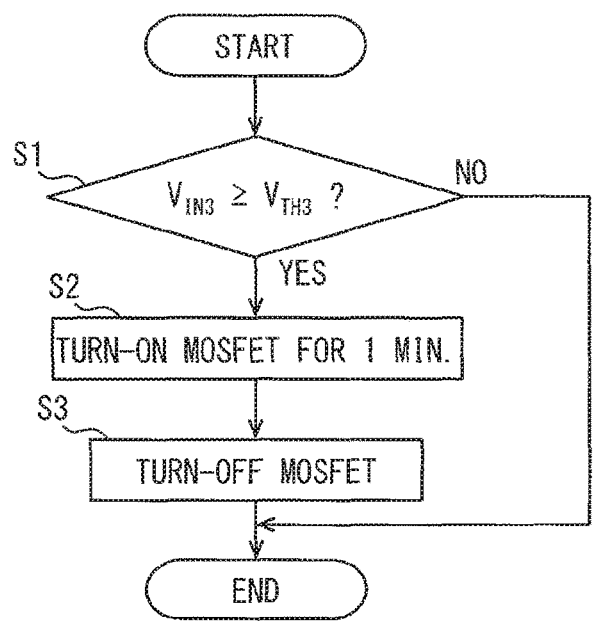
FIG. 20 is a flowchart illustrating a processing executed by a microcomputer of FIG. 19.

The microcomputer 932 executes a processing shown in FIG. 20 periodically. At S1, it is determined whether an input voltage $V_{IN3}$ is equal to or higher than a threshold voltage $V_{TH3}$. When the determination indicates NO, the processing of FIG. 20 is finished.

When the determination at S1 indicates YES, the processing proceeds to S2. At S2, the MOSFET 934 is turned on for one minute. When the MOSFET 934 is turned on, an electric current flows from the power supply wiring 51 to the ground wiring 52 through the resistor 933 to decrease the impedance of the whole circuit network.

After one minute from a time point the MOSFET 934 is turned on, the MOSFET 934 is turned off at S3. One minute, in which the MOSFET 934 is turned on, is just an example, and the MOSFET 934 may be turned on for less or more than one minute.

In the eleventh embodiment, when the microcomputer 932 determines that the input voltage is equal to or higher than the threshold voltage, the microcomputer 932 continues to decrease the impedance as a protection operation for one minute regardless of the voltage variation of the capacitor 25. Therefore, on and off of the MOSFET 934 are less likely to be changed frequently. The microcomputer 932 corresponds to a continuation circuit.

Twelfth Embodiment

Figure 21:
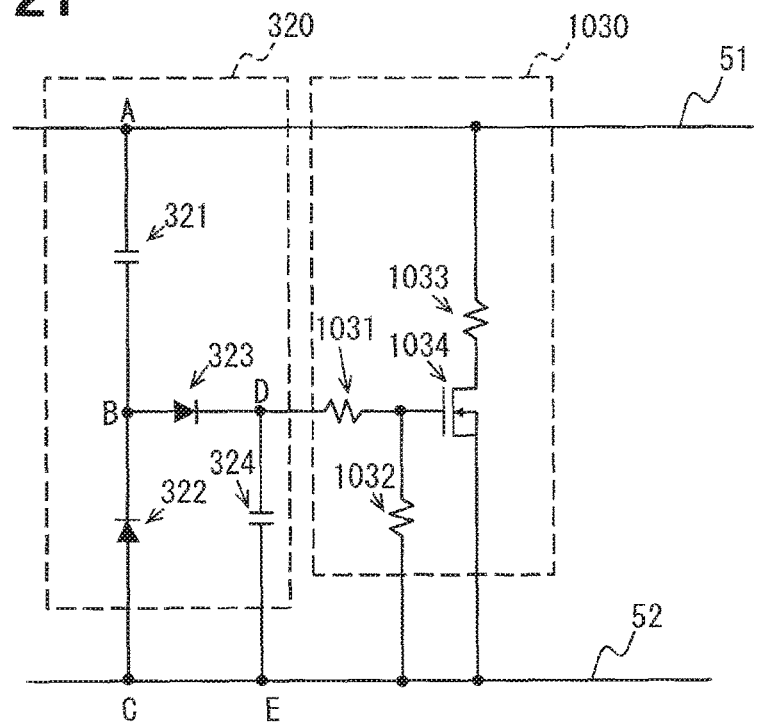
FIG. 21 is a diagram illustrating structures of the detection circuit and an impedance decrease circuit of an ECU according to a twelfth embodiment.

In a twelfth embodiment, as shown in FIG. 21, the electronic device has the detection circuit 320 same as the ninth embodiment, and an impedance decrease circuit 1030. The impedance decrease circuit 1030 includes resistors 1031, 1032, 1033 and a MOSFET 1034.

The resistor 1031 has a first end connected to the first end of the capacitor 324, which is not connected to the ground wiring 52, of the detection circuit 320, and a second end connected to a gate terminal of the MOSFET 1034. The resistor 1032 has a first end connected to a point between the resistor 1031 and the gate terminal of the MOSFET 1034, and a second end connected to the ground wiring 52.

The resistor 1033 has a first end connected to the power supply wiring 51, and a second end connected to a drain terminal of the MOSFET 1034. The resistor 1033 corresponds to a series resistor. The MOSFET 1034 is an n-channel type transistor. The MOSFET 1034 has the gate terminal connected to the resistors 1031, 1032, and a source terminal connected to the ground wiring 52.

As the charged voltage of the capacitor 324 of the detection circuit 320 increases, a gate voltage of the MOSFET 1034 increases and an on-resistance of the MOSFET 1034 decreases. That is, as the charged voltage of the capacitor 324 of the detection circuit 320 increases, the impedance of the whole circuit network decreases.

Since the charged voltage of the capacitor 324 of the detection circuit 320 corresponds to a level of the voltage variation of the noise, in the twelfth embodiment, as the level of the voltage variation of the noise increases, the impedance of the whole circuit network decreases continuously. As such, the malfunction of the ECU 2 can be restricted in the case where the level of the voltage variation of the noise is high. The level of the voltage variation of the power supply wiring 51 decreases until the input voltage of the gate terminal of the MOSFET 1034 decreases to be lower than the on-voltage of the MOSFET 1034.

The impedance decrease circuit 1030 operates using the charged voltage of the capacitor 324, similar to the impedance decrease circuits 630, 730 of the eighth and the ninth embodiments. Therefore, the electricity consumption of the electronic device can be decreased.

Thirteenth Embodiment

Figure 22:
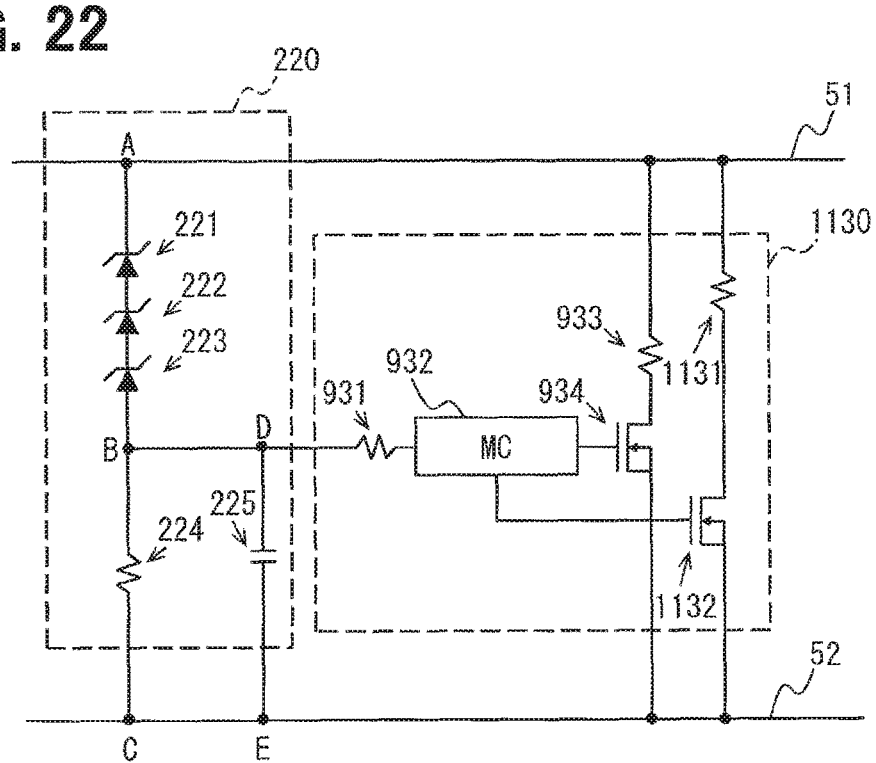
FIG. 22 is a diagram illustrating structures of the detection circuit and an impedance decrease circuit of an ECU according to a thirteenth embodiment.

In a thirteenth embodiment, as shown in FIG. 22, the electronic device has the detection circuit 120 same as the eighth embodiment, and an impedance decrease circuit 1130. The impedance decrease circuit 1130 includes a resistor 1131 and a MOSFET 1132 in addition to the resistor 931, the microcomputer 932, the resistor 933 and the MOSFET 934, which are same as the eleventh embodiment.

The resistor 1131 has a first end connected to the power supply wiring 51, and a second end connected to a drain terminal of the MOSFET 1132. The resistor 1131 corresponds to a series resistor. The MOSFET 1132 has a gate terminal receiving an input signal from the microcomputer 932, and a source terminal connected to the ground wiring 52.

In the thirteenth embodiment, the microcomputer 932 controls the MOSFETs 934, 1132 to turn on and off in accordance with a value of an input voltage, which is a voltage entering the microcomputer 932. Specifically, when the input voltage is equal to or higher than a first threshold voltage and less than a second threshold voltage, the MOSFET 934 is turned on. When the input voltage is equal to or higher than the second threshold voltage, the MOSFETs 934, 1132 are turned on.

A time point the MOSFETs 934, 1132 are turned off may be determined by the input voltage. Alternatively, similar to the eleventh embodiment, the time point the MOSFETs 934, 1132 are turned off may be determined by a time period having passed since the MOSFETs 934, 1132 are turned on.

In the thirteenth embodiment, the number of the MOSFETs 934, 1132 being turned on is changed in accordance with the input voltage of the microcomputer 932. As the number of the MOSFETs 934, 1132 increases, the impedance of the whole circuit network decreases. In the thirteenth embodiment, similar to the twelfth embodiment, the malfunction of the ECU 2 can be restricted in the case where the level of the voltage variation of the noise is high.

Although the embodiments of the present disclosure are described above, the present disclosure is not limited to the embodiments described hereinabove. Following modifications can be included in the technical scope of the present disclosure, and the present disclosure can be changed in various other ways without departing from the gist of the present disclosure.

(Modification 1)

For example, in the embodiments described above, the wire harness 70 supplies power. Alternatively, the wire harness 70 may be a signal line for communication with an external device. In addition to the wire harness 70 supplying the power to the ECU 1 and ECU 2, another wire harness for the communication with the external device may be connected to the ECU 1 and ECU 2.

(Modification 2)

In the embodiments described above, the detection circuit 120 may be used instead of the detection circuit 20. Also, in the embodiments described above, the detection circuit 320 may be used instead of the detection circuit 220.

(Modification 3)

The detection circuits 20, 220 include three Zener diodes 21 to 23 and 221 to 223. The number of the Zener diodes is not always necessary to be three, and may be, for example, one.

(Modification 4)

In the embodiments described above, the MOSFET or an IGBT may be used instead of the bipolar transistor. Conversely, the bipolar transistor or the IGBT may be used instead of the MOSFET.

(Modification 5)

A coil can be used instead of the capacitor 31 and 231 shifting the resonance frequency.

(Modification 6)

The resonance frequency can be shifted using the capacitor 31, 231, and the coil.

(Modification 7)

In the impedance decrease circuit 630, the microcomputer 932 functioning as the continuation circuit may be provided at a point between the resistor 631 and the base terminal of the transistor 634.

What is claimed is:

1. An electronic device having a circuit network therein and conducting at least one of power reception and communication with an external device through a wire harness, the electronic device comprising:
    a detection circuit detecting a voltage variation caused by
        a noise that has a frequency component near a resonance frequency and superimposes on at least one of the wire harness and the circuit network, the resonance frequency being determined based on a characteristic impedance of the wire harness and the circuit network;

a resonance frequency shift circuit shifting the resonance frequency by changing at least one of a capacitance and an inductance of the circuit network based on a level of the voltage variation detected by the detection circuit; and a wiring passing from a connection to the wire harness to the resonance frequency shift circuit and connected to the detection circuit, wherein the detection circuit is connected to the wiring that is included in the circuit network and to be connected to the wire harness, the detection circuit detects the voltage variation caused in the wiring, the detection circuit includes a first capacitor that is charged when a magnitude of the voltage variation is equal to or more than a predetermined voltage, the resonance frequency shift circuit operates with a charged voltage of the first capacitor, the detection circuit further includes a determining element that is connected between the wiring and the first capacitor, and determines that the magnitude of the voltage variation is equal to or more than the predetermined voltage, the detection circuit further includes a discharge resistor that is connected to ground, is connected in parallel with the first capacitor, and discharges the first capacitor, and the resonance frequency shift circuit includes a maintenance circuit that shifts the resonance frequency when the level of the voltage variation detected by the detection circuit is equal to or higher than a predetermined level and maintains the shifted resonance frequency for a predetermined period regardless of the level of the voltage variation detected by the detection circuit.

2. An electronic device having a circuit network therein and conducting at least one of power reception and communication with an external device through a wire harness, the electronic device comprising:

a detection circuit detecting a voltage variation caused by a noise that has a frequency component near a resonance frequency and superimposes on at least one of the wire harness and the circuit network, the resonance frequency being determined based on a characteristic impedance of the wire harness and the circuit network;

a resonance frequency shift circuit shifting the resonance frequency by changing at least one of a capacitance and an inductance of the circuit network based on a level of the voltage variation detected by the detection circuit; and a wiring passing from a connection to the wire harness to the resonance frequency shift circuit and connected to the detection circuit, wherein the detection circuit is connected to the wiring that is included in the circuit network and to be connected to the wire harness, the detection circuit detects the voltage variation caused in the wiring, the detection circuit includes a first capacitor that is charged according to the voltage variation, the resonance frequency shift circuit operates when a charged voltage of the first capacitor is equal to or higher than a predetermined circuit operating voltage, the detection circuit further includes a passing element including a coupling capacitor that is connected between the wiring and the first capacitor, and allows a variation component of the voltage variation to pass through the passing element to charge the first capacitor, the detection circuit further includes a discharge resistor that is connected to ground, is connected in parallel with the first capacitor, and discharges the first capacitor, and the resonance frequency shift circuit includes a maintenance circuit that shifts the resonance frequency when the level of the voltage variation detected by the detection circuit is equal to or higher than a predetermined level and maintains the shifted resonance frequency for a predetermined period regardless of the level of the voltage variation detected by the detection circuit.

3. The electronic device according to claim 1, wherein the resonance frequency shift circuit includes a transistor and at least one of a second capacitor and a coil, the transistor being connected to the circuit network and being on and off by the charged voltage of the first capacitor, and the at least one of the second capacitor and the coil having an electric current an amount of which changes according to on and off of the transistor.

4. The electronic device according to claim 3, wherein the resonance frequency shift circuit includes plural combinations of the transistor and the at least one of the second capacitor and the coil, the transistors of the plural combinations are turned on and off at different charged voltages of the first capacitor.

5. The electronic device according to claim 1, wherein the resonance frequency shift circuit includes a variable capacitor that has an electrostatic capacity changing according to the charged voltage of the first capacitor to continuously shift the resonance frequency.

6. The electronic device according to claim 1, wherein the resonance frequency determined based on the characteristic impedance of the wire harness and the circuit network is referred to as a reference resonance frequency, the resonance frequency shift circuit shifts the reference resonance frequency to a higher resonance frequency higher than the reference resonance frequency and a lower resonance frequency lower than the reference resonance frequency, when the reference resonance frequency is shifted to the higher resonance frequency and the level of the voltage variation detected by the detection circuit is equal to or higher than the predetermined level, the resonance frequency shift circuit shifts the reference resonance frequency to the lower resonance frequency, and when the reference resonance frequency is shifted to the lower resonance frequency and the level of the voltage variation detected by the detection circuit is equal to or higher than the predetermined level, the resonance frequency shift circuit shifts the reference resonance frequency to the higher resonance frequency.

7. An electronic device having a circuit network therein conducting at least one of power reception and communication with an external device through a wire harness, the electronic device comprising:

a detection circuit detecting a voltage variation caused by a noise that has a frequency component near a resonance frequency and superimposes on at least one of the wire harness and the circuit network, the resonance frequency being determined based on a characteristic impedance of the wire harness and the circuit network;

a protection circuit performing a predetermined protection operation based on a level of the voltage variation detected by the detection circuit; and a wiring passing from a connection to the wire harness to the protection circuit and connected to the detection circuit, wherein the detection circuit is connected to the wiring that is included in the circuit network and to be connected to the wire harness, the detection circuit detects the voltage variation caused in the wiring, the detection circuit includes a capacitor that is charged when a magnitude of the voltage variation is equal to or more than a predetermined voltage, the protection circuit performs the predetermined protection operation according to a charged voltage of the capacitor, the detection circuit further includes a determining element that is connected between the wiring and the capacitor, and determines that the magnitude of the voltage variation is equal to or more than the predetermined voltage, the detection circuit further includes a discharge resistor that is connected to ground, is connected in parallel with the capacitor, and discharges the capacitor, the protection circuit includes an impedance decrease circuit that decreases an impedance of the circuit network, the protection circuit decreases the impedance of the circuit network with the impedance decrease circuit as the predetermined protection operation to decrease the voltage variation in the circuit network, the impedance decrease circuit includes a transistor and a series resistor, the transistor being connected to the circuit network and being turned on by the charged voltage of the capacitor, and the series resistor being connected to the transistor in series, and the protection circuit further includes a continuation circuit that initiates the predetermined protection operation when the level of the voltage variation detected by the detection circuit is equal to or higher than a predetermined level and continues the predetermined protection operation for a predetermined period regardless of the level of the voltage variation detected by the detection circuit.

8. An electronic device having a circuit network therein conducting at least one of power reception and communication with an external device through a wire harness, the electronic device comprising:

a detection circuit detecting a voltage variation caused by a noise that has a frequency component near a resonance frequency and superimposes on at least one of the wire harness and the circuit network, the resonance frequency being determined based on a characteristic impedance of the wire harness and the circuit network;

a protection circuit performing a predetermined protection operation based on a level of the voltage variation detected by the detection circuit; and a wiring passing from a connection to the wire harness to the protection circuit and connected to the detection circuit, wherein the detection circuit is connected to the wiring that is included in the circuit network and to be connected to the wire harness, the detection circuit detects the voltage variation caused in the wiring, the detection circuit includes a capacitor that is charged according to the voltage variation, the protection circuit performs the predetermined protection operation when a charged voltage of the capacitor is equal to or higher than a predetermined circuit operating voltage, the detection circuit further includes a passing element including a coupling capacitor that is connected between the wiring and the capacitor, and allows a variation component of the voltage variation to pass through the passing element to charge the capacitor, the detection circuit further includes a pull-down resistor that is connected to ground, is connected in parallel with the capacitor, and pulls down the charged voltage of the capacitor, the protection circuit includes an impedance decrease circuit that decreases an impedance of the circuit network, the protection circuit decreases the impedance of the circuit network with the impedance decrease circuit as the predetermined protection operation to decrease the voltage variation in the circuit network, the impedance decrease circuit includes a transistor and a series resistor, the transistor being connected to the circuit network and being turned on by the charged voltage of the capacitor, and the series resistor being connected to the transistor in series, and the protection circuit further includes a continuation circuit that initiates the predetermined protection operation when the level of the voltage variation detected by the detection circuit is equal to or higher than a predetermined level and continues the predetermined protection operation for a predetermined period regardless of the level of the voltage variation detected by the detection circuit.

9. The electronic device according to claim 7, wherein the protection circuit includes an impedance decrease circuit that decreases an impedance of the circuit network, and the protection circuit decreases the impedance of the circuit network with the impedance decrease circuit, as the predetermined protection operation, to decrease the voltage variation in the circuit network.

10. The electronic device according to claim 7, wherein the protection circuit includes a function suspension circuit that suspends a function of the electronic device, and the protection circuit suspends the function of the electronic device with the function suspension circuit, as the predetermined protection operation.

11. The electronic device according to claim 9, wherein the impedance decrease circuit continuously decreases the impedance according to the level of the voltage variation detected by the detection circuit.

12. The electronic device according to claim 7, wherein the impedance decrease circuit includes plural combinations of the transistor and the series resistor, and the combinations are connected in parallel each other.

13. The electronic device according to claim 1, wherein the determining element includes a Zener diode.

14. The electronic device according to claim 7, wherein the determining element includes a Zener diode.

* * * * *